United States Patent
Cotton et al.

(10) Patent No.: US 10,435,289 B2
(45) Date of Patent: Oct. 8, 2019

(54) DEFORMABLE APPARATUS AND METHOD

(71) Applicant: Nokia Technologies Oy, Espoo (FI)

(72) Inventors: Darryl Cotton, Hemmingford Grey (GB); Adam Robinson, Cambridge (GB); Piers Andrew, Cambridge (GB)

(73) Assignee: Nokia Technoloiges Oy, Espoo (FI)

( * ) Notice: Subject to any disclaimer, the term of this patent is extended or adjusted under 35 U.S.C. 154(b) by 367 days.

(21) Appl. No.: 15/518,053

(22) PCT Filed: Oct. 12, 2015

(86) PCT No.: PCT/FI2015/050680
§ 371 (c)(1),
(2) Date: Apr. 10, 2017

(87) PCT Pub. No.: WO2016/059291
PCT Pub. Date: Apr. 21, 2016

(65) Prior Publication Data
US 2017/0305741 A1    Oct. 26, 2017

(30) Foreign Application Priority Data

Oct. 16, 2014 (EP) .................................... 14189248
Feb. 4, 2015 (EP) .................................... 15153847

(51) Int. Cl.
*B81B 7/00* (2006.01)
*H05K 1/02* (2006.01)
*H05K 1/16* (2006.01)

(52) U.S. Cl.
CPC ......... *B81B 7/0054* (2013.01); *H05K 1/0283* (2013.01); *H05K 1/167* (2013.01);
(Continued)

(58) Field of Classification Search
CPC .......... B81B 7/0054; B81B 2201/0292; B81B 2201/0278; H05K 1/0283; H05K 1/167;
(Continued)

(56) References Cited

U.S. PATENT DOCUMENTS 6,532,824 B1    3/2003    Ueno et al.
7,395,717 B2    7/2008    DeAngelis et al.
(Continued)

FOREIGN PATENT DOCUMENTS

CN    1157594 C    7/2004
CN    102113089 A   6/2011
(Continued)

OTHER PUBLICATIONS

Sekitani et al., "Stretchable Active-Matrix Organic Light-emitting Diode Display Using Printable Elastic Conductors", Nature Materials, vol. 8, Jun. 2009, 23 pages.
(Continued)

*Primary Examiner* — Jonathan M Dunlap
(74) *Attorney, Agent, or Firm* — Nokia Technologies Oy

(57) ABSTRACT

An apparatus and method wherein the method comprises: a deformable substrate; a curved support structure configured to support at least a portion of a resistive sensor wherein the resistive sensor comprises a first electrode, a second electrode and a resistive sensor material provided between the electrodes; at least one support configured to space the curved support structure from the deformable substrate so that when the deformable substrate is deformed the curved support structure is not deformed in the same way; wherein the resistive sensor is positioned on the curved support structure so as to limit deformation of the resistive sensor when the deformable substrate is deformed.

20 Claims, 15 Drawing Sheets

Figure 1:
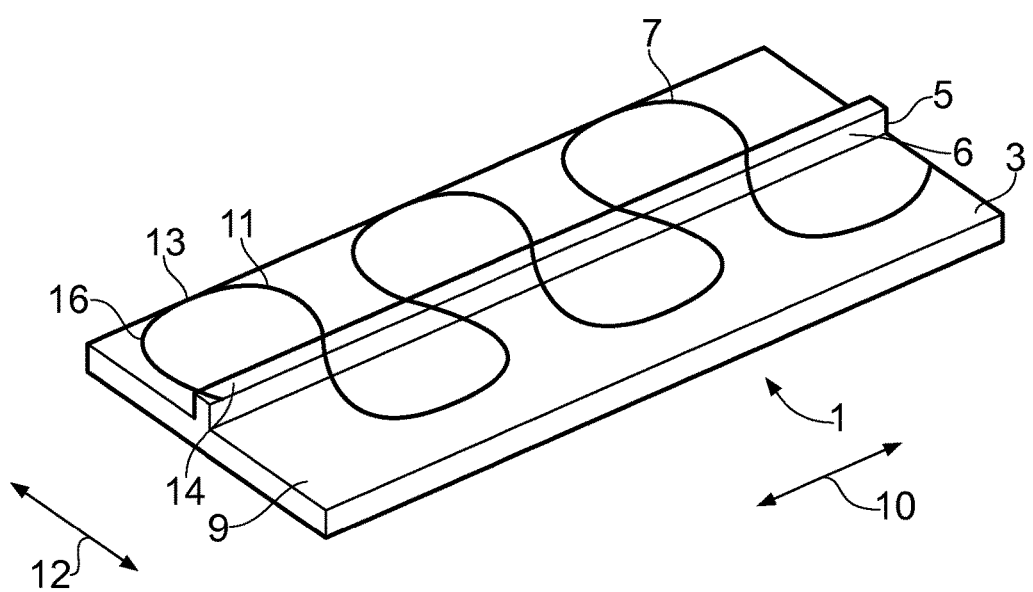

(52) U.S. Cl.
CPC ........... *B81B 2201/0278* (2013.01); *B81B 2201/0292* (2013.01); *H05K 2201/09018* (2013.01); *H05K 2201/09109* (2013.01); *H05K 2201/09263* (2013.01); *H05K 2201/10151* (2013.01)

(58) Field of Classification Search
CPC .......... H05K 2201/10151; H05K 2201/09263; H05K 2201/09109; H05K 2201/09018
See application file for complete search history.

(56) References Cited

U.S. PATENT DOCUMENTS

| | | | |
|---|---|---|---|
| 7,814,801 B2 * | 10/2010 | Inamori | G01B 7/18 73/849 |
| 8,161,826 B1 | 4/2012 | Taylor | |
| 8,332,053 B1 | 12/2012 | Patterson et al. | |
| 8,895,864 B2 * | 11/2014 | Cotton | H05K 1/0283 174/254 |
| 9,904,425 B2 * | 2/2018 | Cotton | G06F 3/044 |
| 10,197,459 B2 * | 2/2019 | Keller | G01L 1/144 |
| 10,209,830 B2 * | 2/2019 | Pedder | G01L 1/18 |
| 2002/0094701 A1 | 7/2002 | Biegelsen et al. | |
| 2002/0197002 A1 | 12/2002 | Lin | |
| 2004/0016568 A1 | 1/2004 | Palanisamy | |
| 2006/0286785 A1 | 12/2006 | Rogers et al. | |
| 2007/0029671 A1 | 2/2007 | Yamasaki | |
| 2008/0149372 A1 | 6/2008 | Choi et al. | |
| 2009/0158856 A1 | 6/2009 | Harish et al. | |
| 2010/0140785 A1 | 6/2010 | Killer et al. | |
| 2010/0143848 A1 * | 6/2010 | Jain | B81C 1/0019 430/315 |
| 2010/0162824 A1 | 7/2010 | Jamshidi et al. | |
| 2010/0251706 A1 | 10/2010 | Edler et al. | |
| 2010/0307238 A1 | 12/2010 | Van Popta et al. | |
| 2010/0330338 A1 | 12/2010 | Boyce et al. | |
| 2011/0309526 A1 | 12/2011 | Cho et al. | |
| 2012/0051005 A1 | 3/2012 | Vanfleteren et al. | |
| 2012/0052268 A1 | 3/2012 | Axisa et al. | |
| 2012/0069584 A1 | 3/2012 | Kawabe et al. | |
| 2013/0027344 A1 | 1/2013 | Choon | |
| 2013/0041235 A1 | 2/2013 | Rogers et al. | |
| 2013/0256004 A1 | 10/2013 | Cotton et al. | |
| 2013/0320467 A1 | 12/2013 | Buchanan et al. | |
| 2014/0022746 A1 | 1/2014 | Hsu | |
| 2014/0027053 A1 | 1/2014 | Uetani et al. | |
| 2014/0039290 A1 | 2/2014 | De Graff et al. | |
| 2014/0321126 A1 | 10/2014 | Narag et al. | |
| 2015/0373831 A1 * | 12/2015 | Rogers | H01L 23/18 429/121 |

FOREIGN PATENT DOCUMENTS

| | | |
|---|---|---|
| EP | 1113252 A1 | 7/2001 |
| EP | 1783555 A2 | 5/2007 |
| GB | 2524327 A | 9/2015 |
| JP | 2001358422 A | 12/2001 |
| JP | 2005209729 A | 8/2005 |
| JP | 2005-235997 A | 9/2005 |
| JP | 2006-005026 A | 1/2006 |
| JP | 2007-250998 A | 9/2007 |
| JP | 2008204037 A | 9/2008 |
| JP | 2008235594 A | 10/2008 |
| JP | 2009-094099 A | 4/2009 |
| JP | 2010251706 A | 11/2010 |
| JP | 2013-187308 A | 9/2013 |
| KR | 2008-0043068 A | 5/2008 |
| WO | 2005/121812 A1 | 12/2005 |
| WO | 2007/097366 A1 | 8/2007 |
| WO | 2010/109844 A1 | 9/2010 |
| WO | 2010/131578 A1 | 11/2010 |
| WO | 2012/133530 A1 | 10/2012 |
| WO | 2013/019510 A1 | 2/2013 |
| WO | 2013/144738 A3 | 10/2013 |
| WO | 2013/144788 A1 | 10/2013 |
| WO | 2013/149181 A1 | 10/2013 |
| WO | 2013/165681 A1 | 11/2013 |
| WO | 2014124049 | 8/2014 |

OTHER PUBLICATIONS

Lu et al., "Delamination of Stiff Islands Patterned on Stretchable Substrates", International Journal of Materials Research, vol. 98, No. 8, Aug. 2007, pp. 717-722.

Sluis et al., "Stretching Induced Interconnect Delamination in Stretchable Electronic Circuits", Journal of Physics D: Applied Physics, vol. 44, No. 3, 2011, pp. 1-19.

Cheng et al., "Analysis of a Concentric Coplanar Capacitor for Epidermal Hydration Sensing", Sensors and Actuators A: Physical, vol. 203, 2013, pp. 149-153.

Kim et al., "Epidermal electronics", Science, vol. 333, No. 6044, 2011, pp. 838-843.

Cotton et al., "A multifunctional capacitive sensor for stretchable electronic skins", IEEE Sensors Journal, vol. 9, No. 12, 2009, 2 Pages.

Cai et al., "Super-stretchable, Transparent Carbon Nanotube-Based Capacitive Strain Sensors for Human Motion Detection", Scientific Reports, vol. 3, No. 3048, 2013, pp. 1-9.

Cheng et al., "A Polymer-based Capacitive Sensing Array for Normal and Shear Force Measurement", Sensors, vol. 10, No. 11, 2010, pp. 10211-10225.

Roberts et al., "Soft-matter Capacitive Sensor for Measuring Shear and Pressure Deformation" IEEE International Conference on Robotics and Automation, 2013, pp. 3529-3534.

Gutruf et al., "Strain Response of Stretchable Micro-Electrodes: Controlling Sensitivity With Serpentine Designs and Encapsulation", Applied Physics Letters, vol. 104, No. 2, Jan. 2014, pp. 1-4.

Search Report received for corresponding United Kingdom Patent Application No. 1405081.9, dated Aug. 14, 2014, 3 pages.

Chortos et al., "Highly Stretchable Transistors Using a Microcracked Organic Semiconductor", Advanced Materials, vol. 26, No. 25, Jul. 2014, pp. 4253-4259.

Lee et al., "Stretchable Graphene Transistors With Printed Dielectrics and Gate Electrodes", Nano Letters, vol. 11, Oct. 5, 2011, pp. 4642-4646.

Xu et al., "Highly Stretchable Carbon Nanotube Transistors With Ion Gel Gate Dielectrics", Nano Letters, vol. 14, Jan. 1, 2014, 17 pages.

Chae et al., "Transferred Wrinkled Al2O3 for Highly Stretchable and Transparent Graphene-carbon Nanotube Transistors", Nature Materials, vol. 12, May 2013, pp. 403-409.

Graz et al., "Silicone Substrate With In Situ Strain Relief for Stretchable Thin-film Transistors", Applied Physics Letters, vol. 98, No. 12, Mar. 2011, pp. 124101-1-124101-3.

Robinson et al., "Hybrid Stretchable Circuits on Silicone Substrate", Journal of Applied Physics, vol. 115, No. 4, Apr. 2014, pp. 143511-1-143511-5.

Extended European Search Report received for corresponding European Patent Application No. 14189254.7, dated Apr. 23, 2015, 4 pages.

Extended European Search Report received for corresponding European Patent Application No. 14189248.9, dated May 4, 2015, 9 pages.

International Search Report and Written Opinion received for corresponding Patent Cooperation Treaty Application No. PCT/FI2015/050131, dated Jun. 9, 2015, 12 pages.

International Search Report and Written Opinion received for corresponding Patent Cooperation Treaty Application No. PCT/FI2015/050635, dated Nov. 20, 2015, 10 pages.

Extended European Search Report received for corresponding European Patent Application No. 15153847.7, dated Feb. 3, 2016, 10 pages.

Office Action received for corresponding European Patent Application No. 15153847.7, dated May 10, 2017, 6 pages.

(56) References Cited

OTHER PUBLICATIONS

International Search Report and Written Opinion received for corresponding Patent Cooperation Treaty Application No. PCT/FI2015/050680, dated Feb. 3, 2016, 16 pages.

Forseberg F et. al. "Paper; Heterogeneous 3D integration of 17 m pitch Si/SiGe quantum well bolometer arrays for infrared imaging systems; Heterogeneous 3D integration of 17/mum pitch Si-/SiGe quantum well bolometer arrays for infrared imaging systems", Journal of Micromechanics & Microengineering, Institute of Physics Publishing, Brstol, GB vol. 23, No. 4, Mar. 6, 2013 p. 45017.

Non-Final Office action received for corresponding U.S. Appl. No. 15/126,012, dated Aug. 11, 2017, 9 pages.

Office action received for corresponding Japanese Patent Application No. 2017-500442, dated Sep. 26, 2017, 3 pages of office action and 5 pages of translation available.

Final Office action received for corresponding U.S. Appl. No. 15/126,012, dated Nov. 30, 2017, 14 pages.

Non-Final Office action received for corresponding U.S. Appl. No. 15/126,012, dated Mar. 9, 2018, 11 pages.

Non-Final Office action received for corresponding U.S. Appl. No. 15/517,933, dated Apr. 10, 2018, 7 pages.

Office action received for corresponding Chinese Patent Application No. 201580067857.8, dated May 3, 2018, 8 pages of office action and no page of translation available.

Office action received for corresponding Japanese Patent Application No. 2017-520341, dated May 8, 2018, 4 pages of office action and 6 page of translation available.

Final Office action received for corresponding Japanese Patent Application No. 2017-500442, dated Jun. 5, 2018, 3 pages of office action and 6 pages of translation available.

Office action received for corresponding Mexican Patent Application No. MX/A/2016/011835, dated Jun. 14, 2018, 3 pages of office action and no page of translation available.

Non-Final Office action received for corresponding U.S. Appl. No. 15/126,012, dated Jun. 21, 2018, 12 pages.

Office action received for corresponding European Patent Application No. 15709977.1, dated Aug. 13, 2018, 5 pages.

Office action received for corresponding Chinese Patent Application No. 201580067853.X, dated Aug. 28, 2018, 5 pages of office action and no page of translation available.

Non-Final Office action received for corresponding U.S. Appl. No. 15/517,933, dated Nov. 19, 2018, 05 pages.

Office action received for corresponding Chinese Patent Application No. 201580067857.8, dated Dec. 6, 2018, 6 pages of office action and no page of translation available.

\* cited by examiner

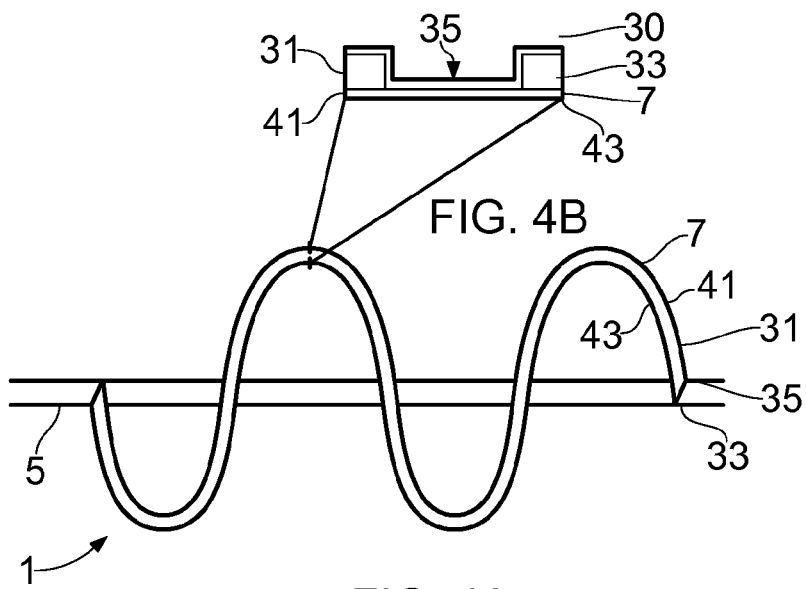
FIG. 4B
FIG. 4A
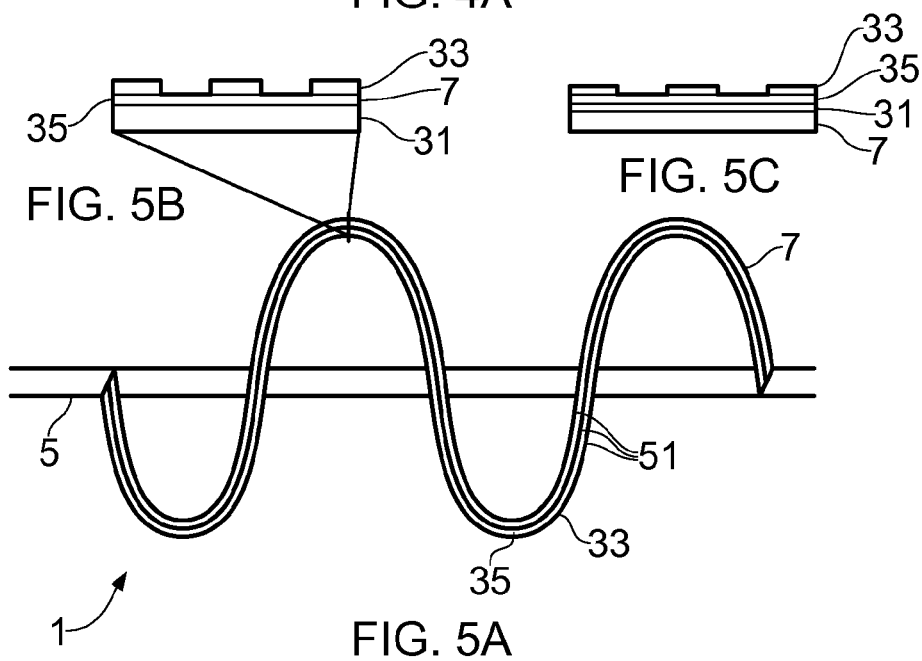
FIG. 5B
FIG. 5C
FIG. 5A
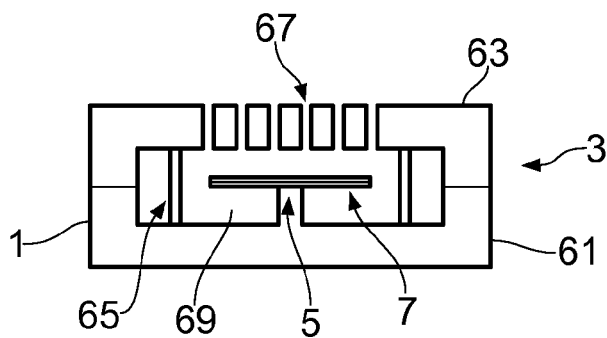
FIG. 6

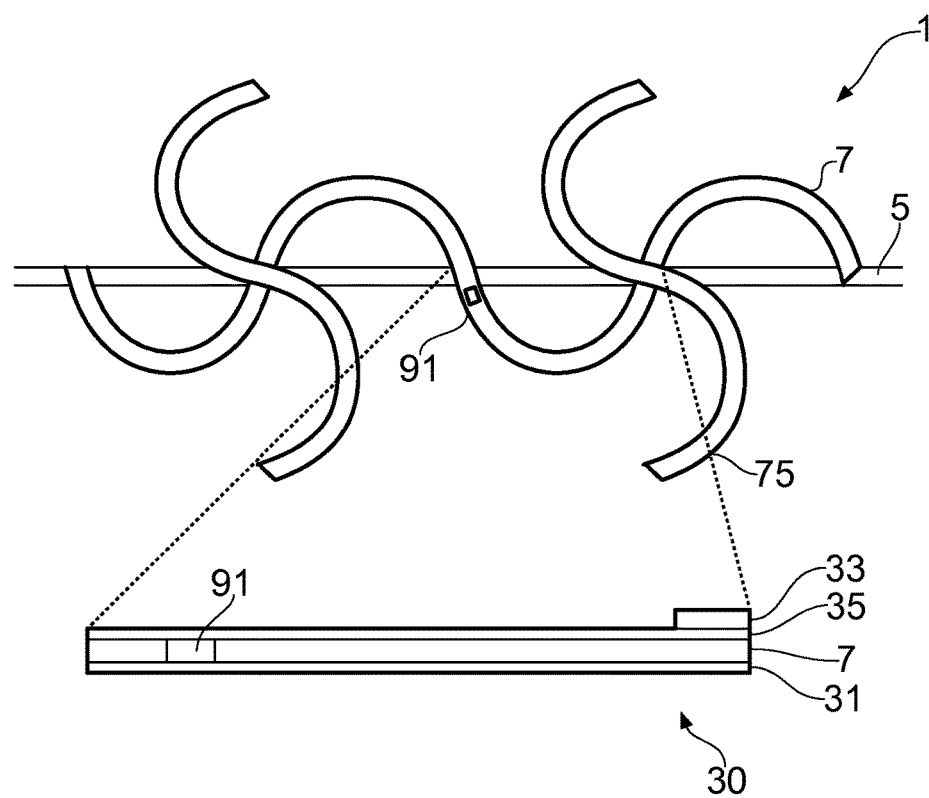

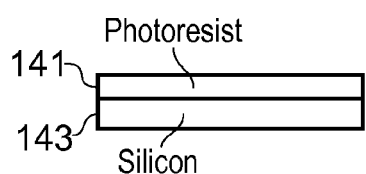
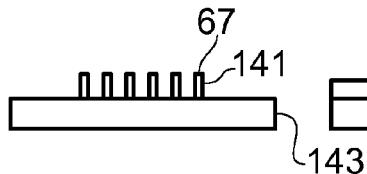
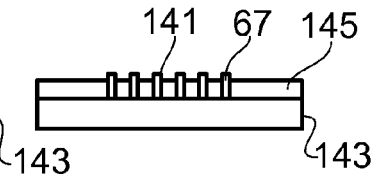
FIG. 12A    FIG. 12B    FIG. 12C
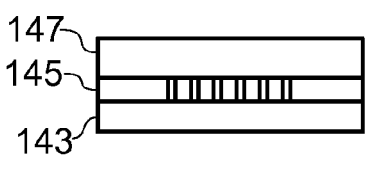
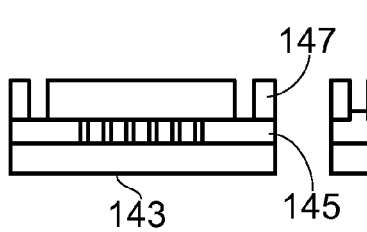
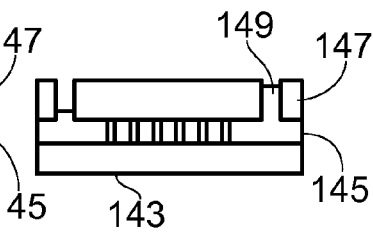
FIG. 12D    FIG. 12E    FIG. 12F
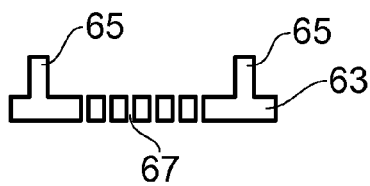
FIG. 12G
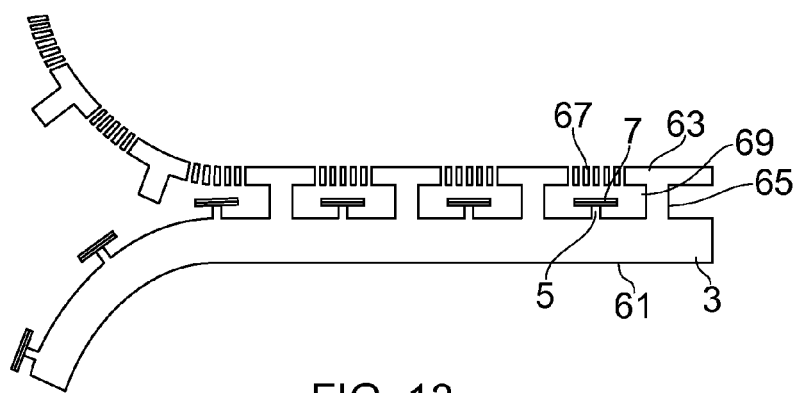
FIG. 13

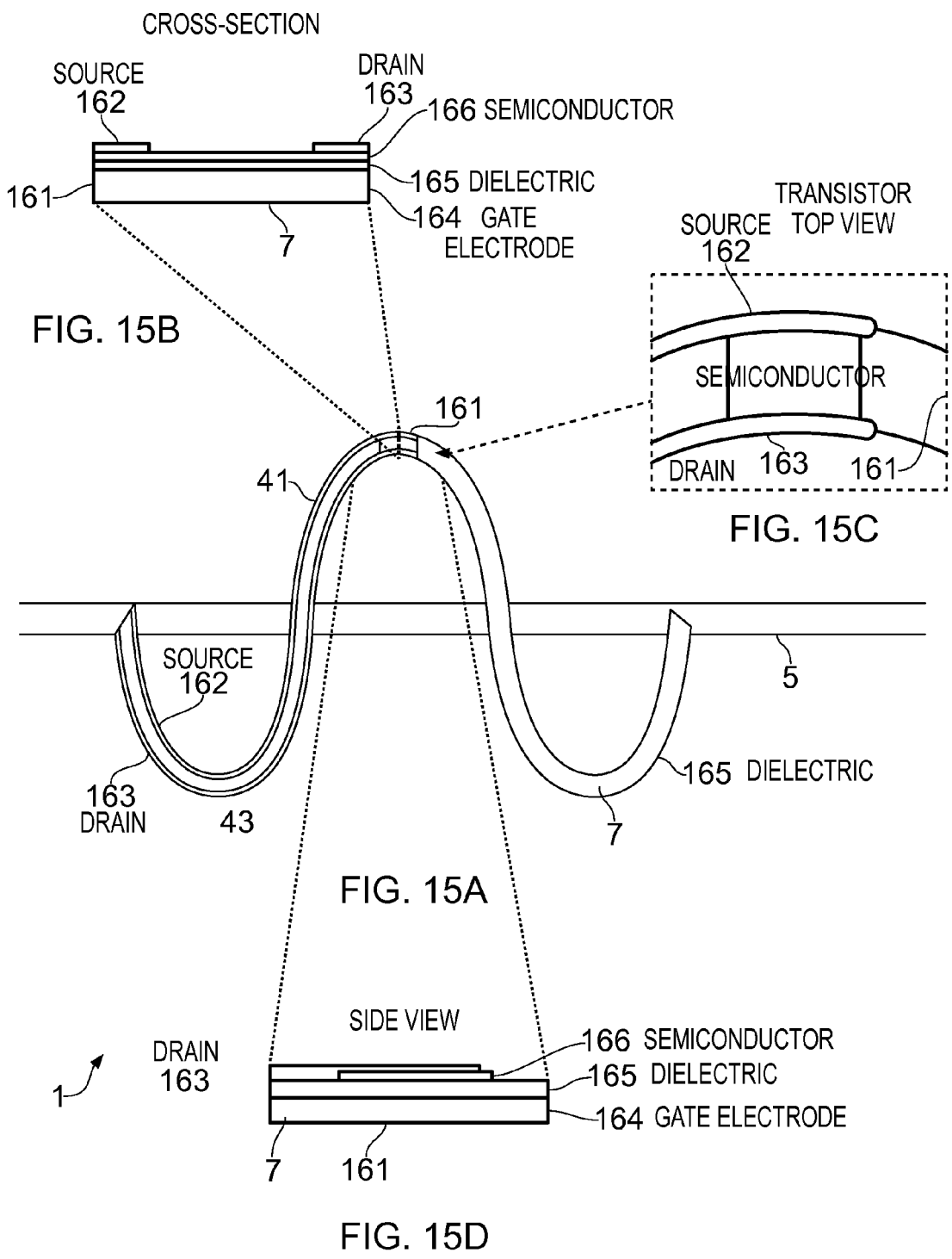

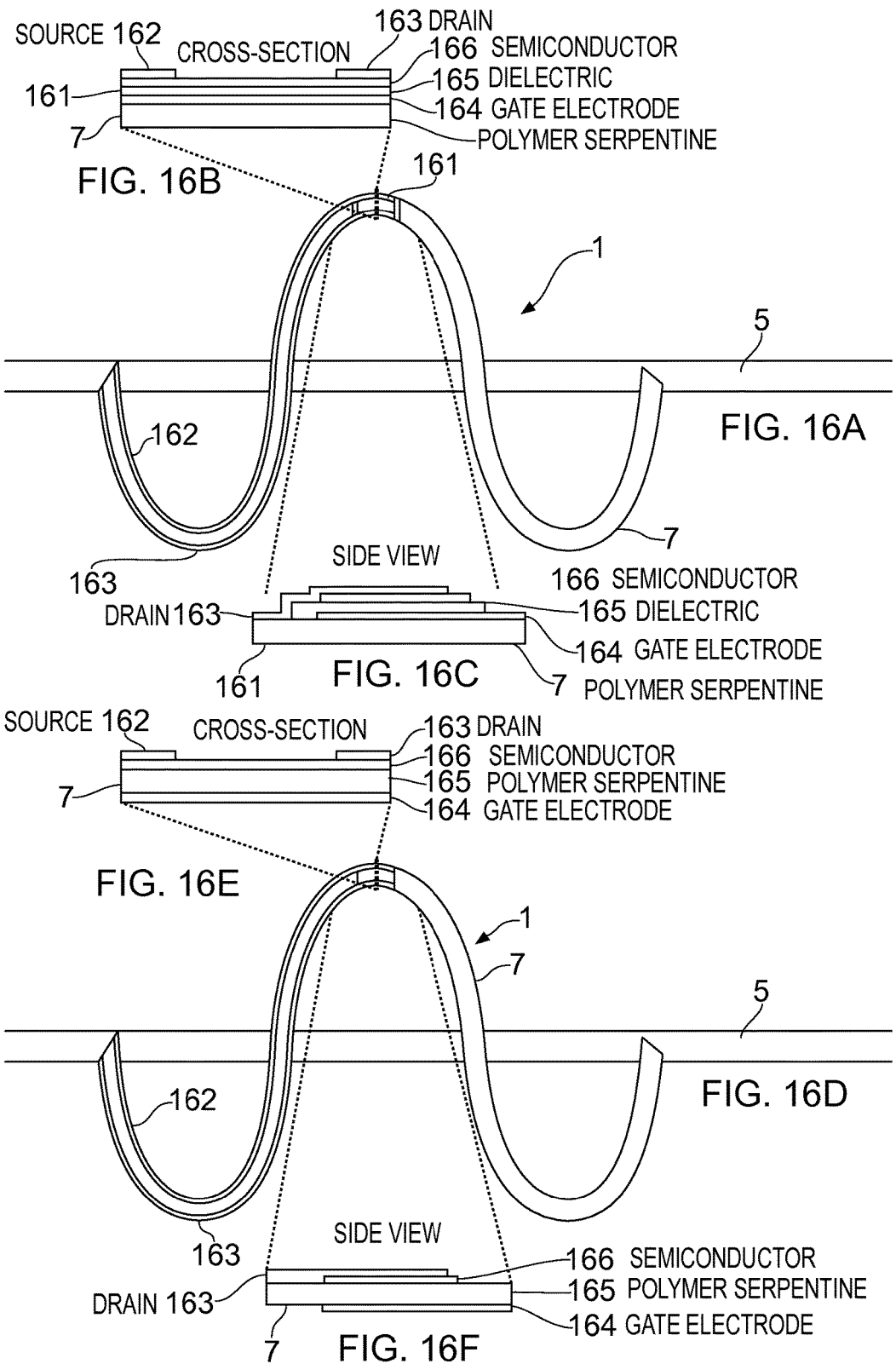

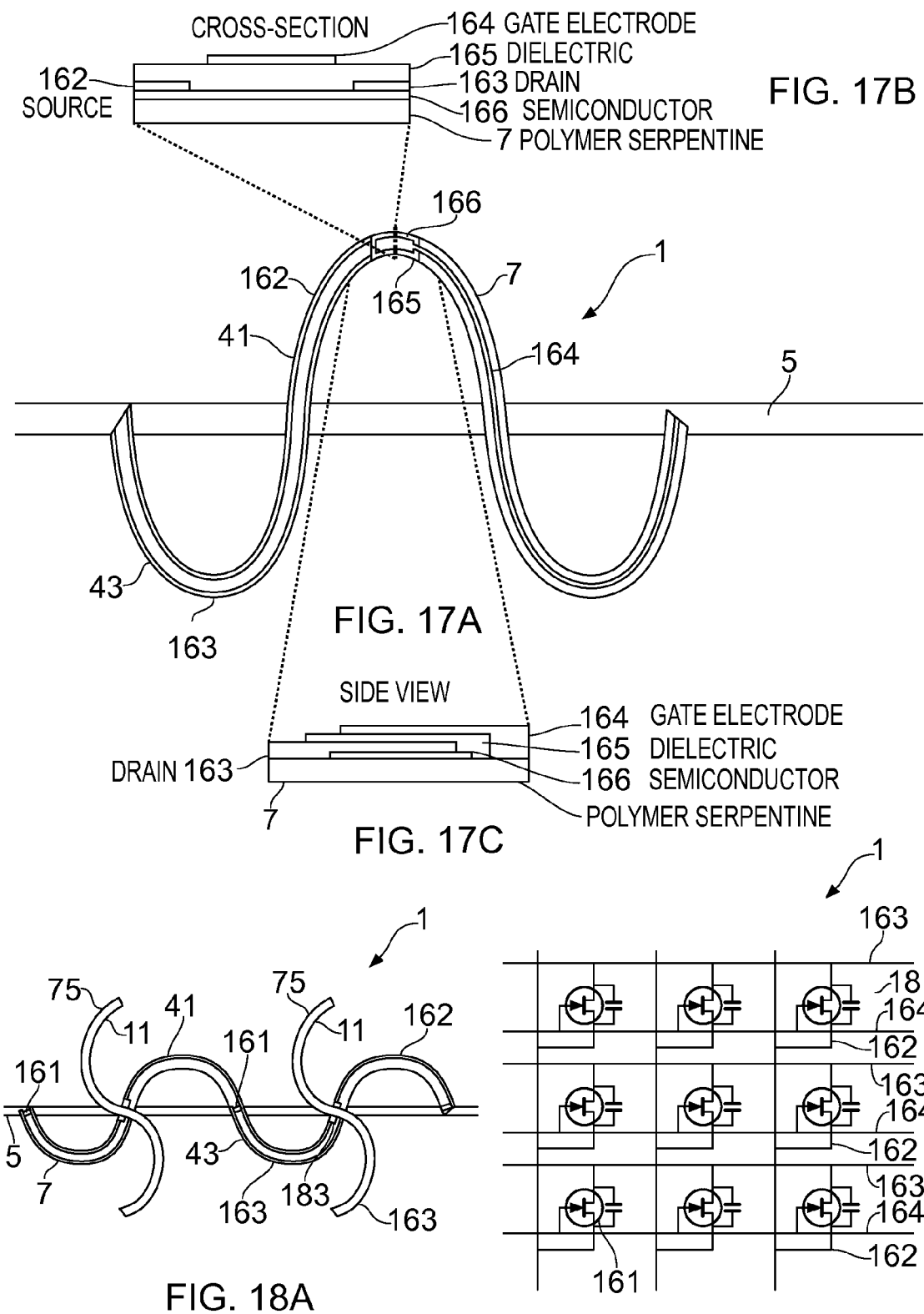

DEFORMABLE APPARATUS AND METHOD

RELATED APPLICATION

This application was originally filed as PCT Application No. PCT/FI2015/050680 filed Oct. 12, 2015, which claims priority benefit from EP Application No. 15153847.7 filed Feb. 4, 2015, for which claims priority benefit from EP Application No. 14189248.9 filed Oct. 16, 2014.

TECHNOLOGICAL FIELD

Examples of the present disclosure relate to a deformable apparatus and method. In particular, they relate to a deformable apparatus and method wherein the apparatus is configured for sensing.

BACKGROUND

Materials with resistive characteristics configured to respond to a change in one or more physical parameters are known. Such materials can be incorporated into sensors to enable the physical parameter or a change in the physical parameter to be detected. Physical parameters which can be detected using such materials comprise temperature, humidity, strain, chemical and biological parameters or any other suitable parameter.

It is useful to be able to incorporate these sensors into a deformable apparatus such as a stretchable and/or bendable electronic device. When such sensors are incorporated into a deformable apparatus it is necessary to ensure that the sensors can perform reliably during stretching or other deformation of the apparatus. It is also useful to incorporate the sensors into the apparatus without affecting the ability of the deformable apparatus to be stretched or otherwise deformed repeatedly.

BRIEF SUMMARY

According to various, but not necessarily all, examples of the disclosure, there may be provided an apparatus comprising: a deformable substrate; a curved support structure configured to support at least a portion of a resistive sensor wherein the resistive sensor comprises a first electrode, a second electrode and a resistive sensor material provided between the electrodes; at least one support configured to space the curved support structure from the deformable substrate so that when the deformable substrate is deformed the curved support structure is not deformed in the same way; wherein the resistive sensor is positioned on the curved support structure so as to limit deformation of the resistive sensor when the deformable substrate is deformed.

In some examples the electrodes may extend along a length of the curved support structure.

In some examples a plurality of resistive sensors may be provided on the curved support structure.

In some examples a plurality of curved support structures may be provided.

In some examples a first plurality of curved support structures may be provided extending in a first direction and a second plurality of curved structures are provided overlaying the first plurality of curved support structures and extending in a second direction where the second direction is perpendicular to the first direction. The second electrode may be provided on a second curved structure. The first curved support structure may comprise a polymer layer provided between the first electrode and the second electrode. A via may be provided through the polymer layer to connect the first electrode and the second electrode.

In some examples the first curved support structure may comprise the first electrode such that the resistive sensor material and the second electrode are supported by the first electrode.

In some examples the first curved support structure may comprise a polymer layer and the first and second electrodes and the resistive sensor material are supported by the polymer layer.

In some examples the resistive sensor may comprise a transistor. The transistor may further comprise a gate electrode. In some examples the transistor may be configured in a top-gate arrangement. In some examples the transistor may be configured in a bottom-gate arrangement. In some examples the first curved support structure may comprise a gate electrode. In some examples the gate electrode may be provided overlaying the first curved support structure. In some examples the gate electrode may be provided underneath the first curved support structure. The first curved support structure may comprise a dielectric within the transistor.

In some examples the deformable substrate may form a cavity in which the curved support structure and resistive sensor are provided.

In some examples a radius of curvature of the curved support structure may be parallel to a plane of the deformable substrate.

In some examples the curved support structure may have a serpentine shape. The serpentine shape may comprise a plurality of loops such that a loop which extends to a left hand side is followed by a loop which extends to a right hand side.

In some examples the deformable substrate may be configured to be deformed in response to a force applied by a user.

According to various, but not necessarily all, examples of the disclosure, there may be provided an electronic device comprising an apparatus as described above.

According to various, but not necessarily all, examples of the disclosure, there may be provided a method comprising: providing a deformable substrate; providing a curved support structure configured to support at least a portion of a resistive sensor wherein the resistive sensor comprises a first electrode, a second electrode and a resistive sensor material provided between the electrodes; providing at least one support configured to space the curved support structure from the deformable substrate so that when the deformable substrate is deformed the curved support structure is not deformed in the same way; wherein the resistive sensor is positioned on the curved support structure so as to limit deformation of the resistive sensor when the deformable substrate is deformed.

In some examples the electrodes may extend along a length of the curved support structure.

In some examples a plurality of resistive sensors may be provided on the curved support structure.

In some examples a plurality of curved support structures may be provided.

In some examples a first plurality of curved support structures may be provided extending in a first direction and a second plurality of curved structures may be provided overlaying the first plurality of curved support structures and extending in a second direction where the second direction is perpendicular to the first direction. The second electrode may be provided on a second curved structure. The first curved support structure may comprise a polymer layer provided between the first electrode and the second electrode. A via may be provided through the polymer layer to connect the first electrode and the second electrode.

In some examples the first curved support structure may comprise the first electrode such that the resistive sensor material and the second electrode are supported by the first electrode.

In some examples the first curved support structure may comprise a polymer layer and the first and second electrodes and the resistive sensor material are supported by the polymer layer.

In some examples the resistive sensor may comprise a transistor. The transistor may further comprise a gate electrode. In some examples the transistor may be configured in a top-gate arrangement. In some examples the transistor may be configured in a bottom-gate arrangement. In some examples the first curved support structure may comprise a gate electrode. In some examples the gate electrode may be provided overlaying the first curved support structure. In some examples the gate electrode may be provided underneath the first curved support structure. The first curved support structure may comprise a dielectric within the transistor.

In some examples the deformable substrate may form a cavity in which the curved support structure and resistive sensor are provided.

In some examples a radius of curvature of the curved support structure may be parallel to a plane of the deformable substrate.

In some examples the curved support structure may have a serpentine shape. The serpentine shape may comprise a plurality of loops such that a loop which extends to a left hand side is followed by a loop which extends to a right hand side.

In some examples the deformable substrate may be configured to be deformed in response to a force applied by a user.

According to various, but not necessarily all, examples of the disclosure, there may be provided an apparatus comprising: a deformable substrate; a curved support structure configured to support at least a portion of a transistor comprising a sensing material; at least one support configured to space the curved support structure from the deformable substrate so that when the deformable substrate is deformed the curved support structure is not deformed in the same way; wherein the transistor is positioned on the curved support structure so as to limit the deformation of the transistor when the deformable substrate is deformed.

BRIEF DESCRIPTION

Figure 2A:
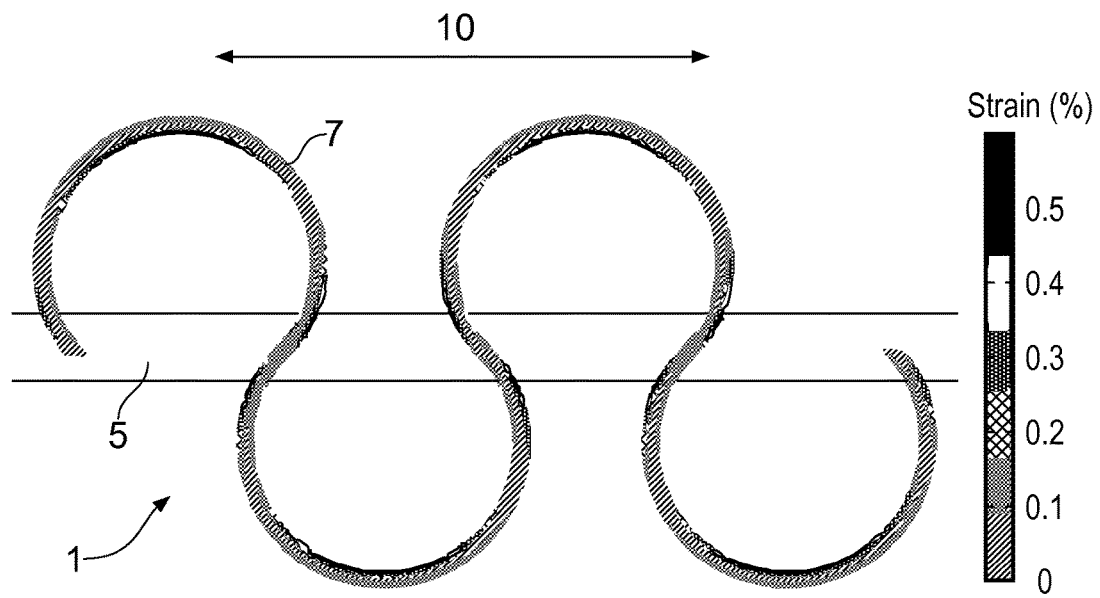
Figure 2B:
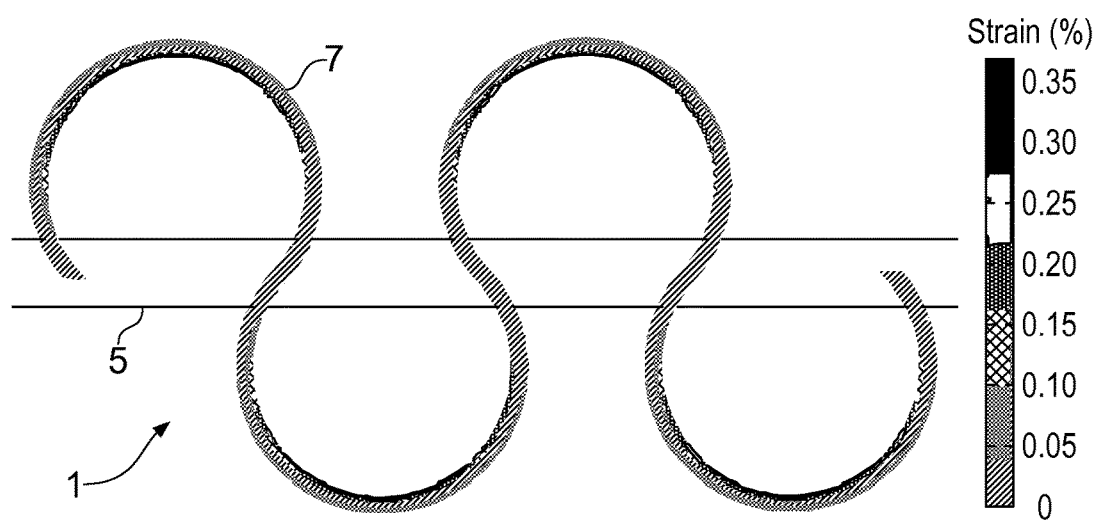
Figures 3A, 3B:
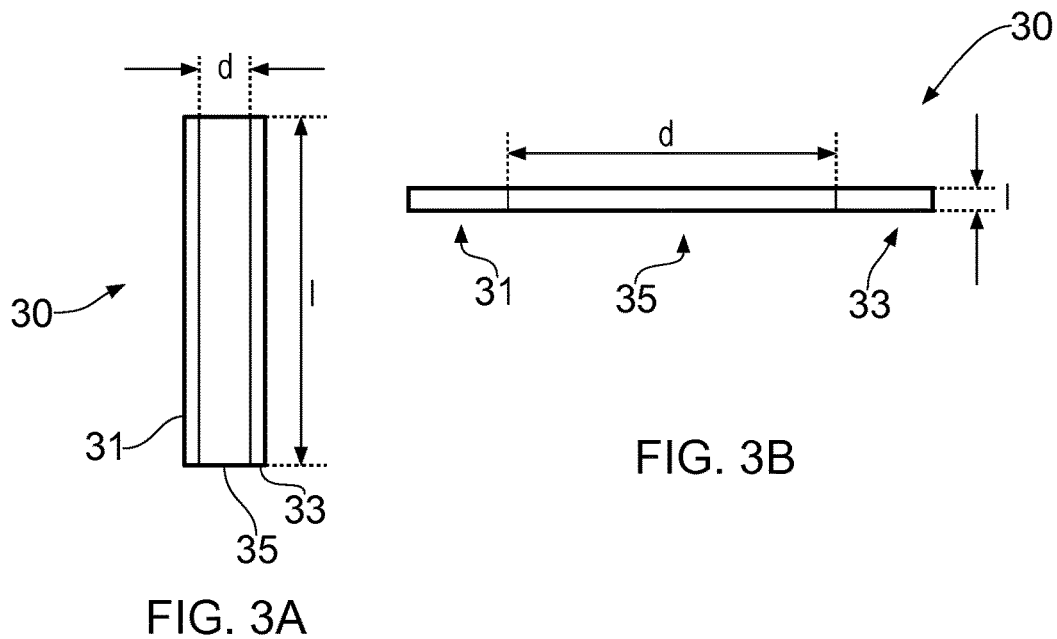
Figures 7A, 7B:
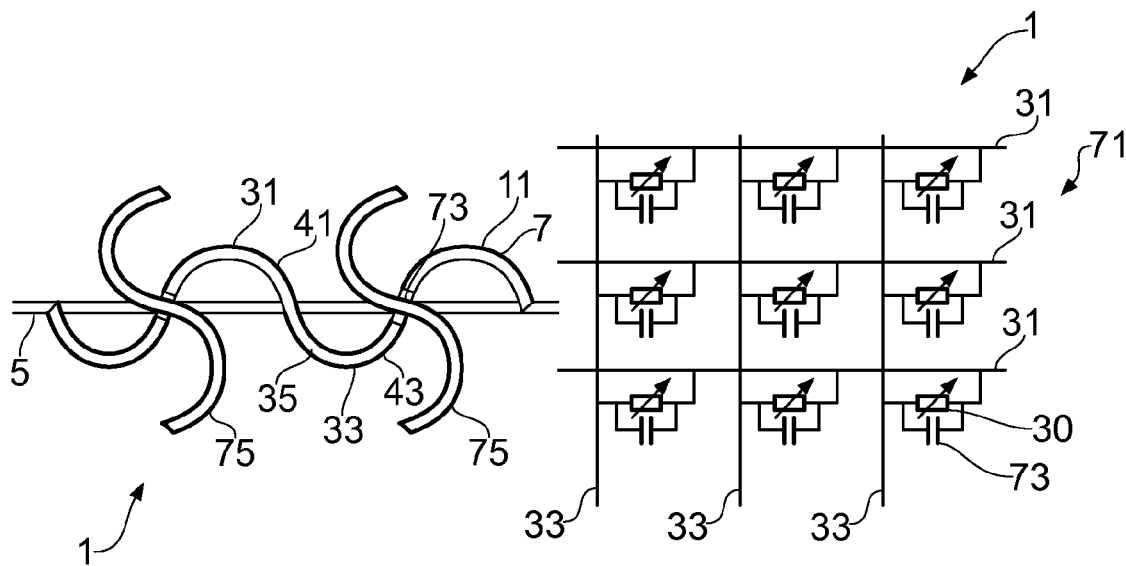
Figures 8A, 8B:
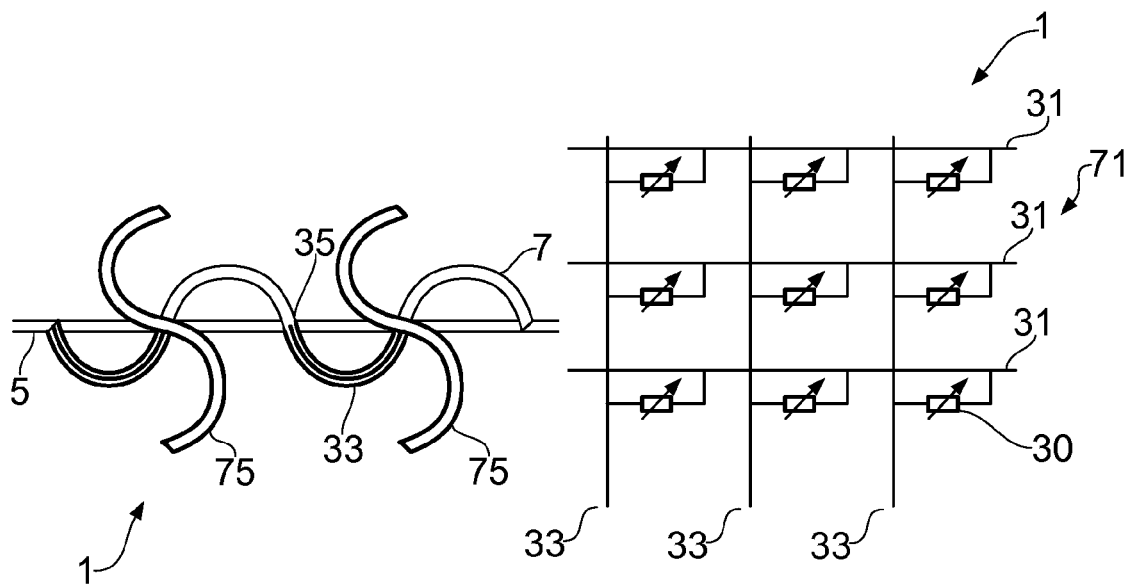
Figure 10:
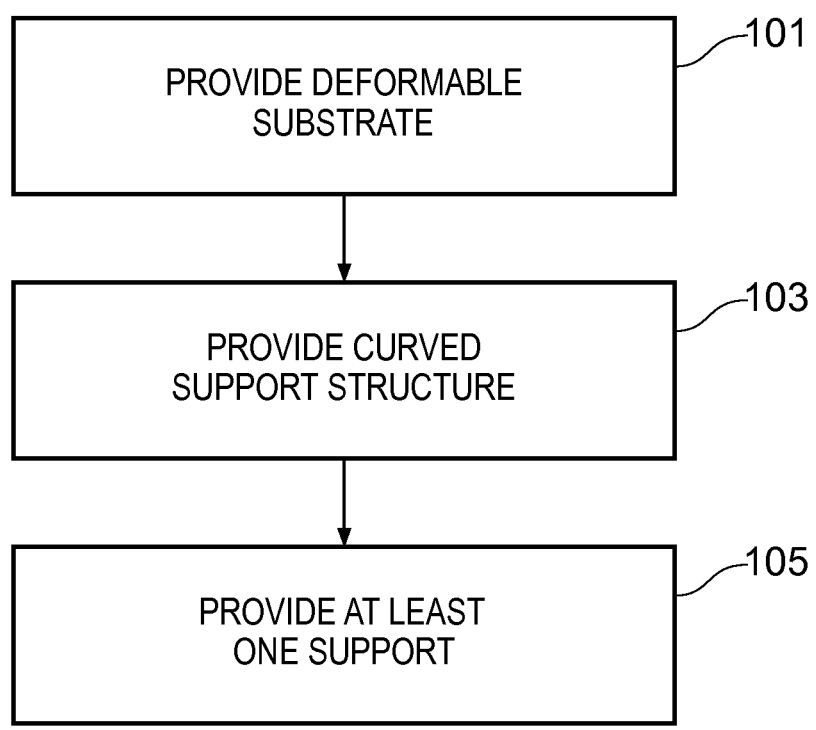
Figures 11A, 11B, 11C, 11D:
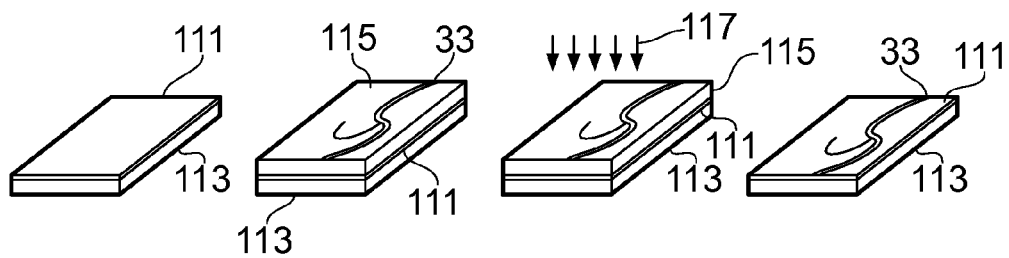
Figure 19:
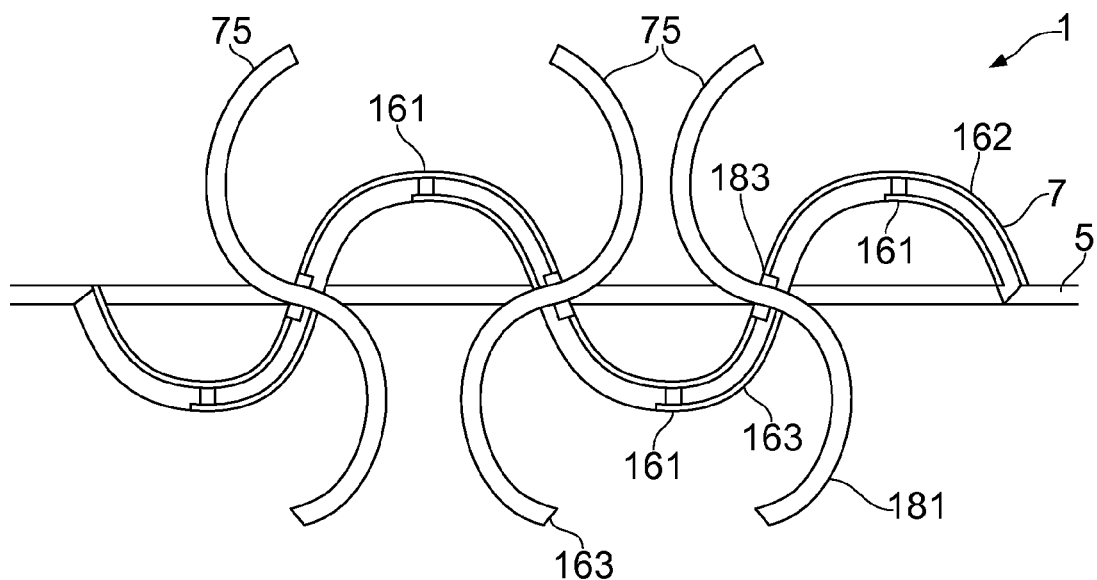
Figure 20A:
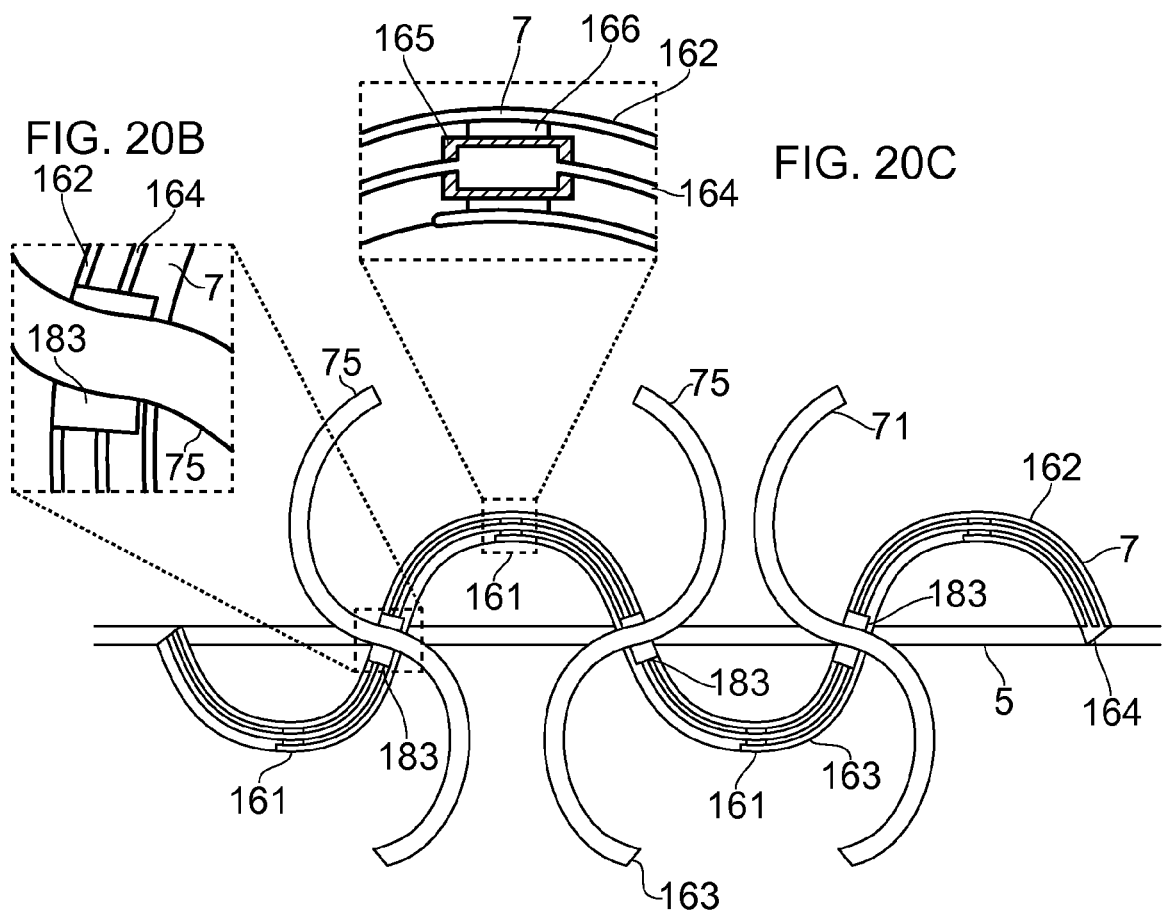
Figure 21A:
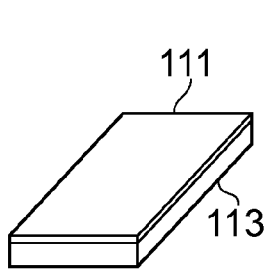
Figure 21B:
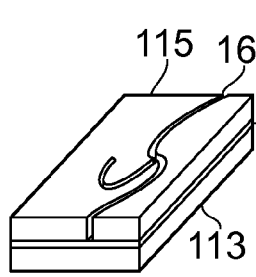
Figure 21C:
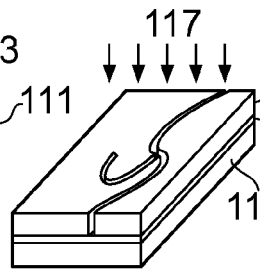
Figure 21D:
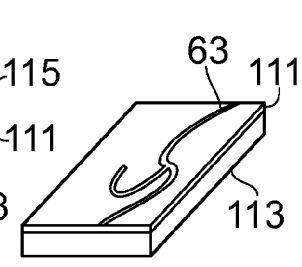

For a better understanding of various examples that are useful for understanding the detailed description, reference will now be made by way of example only to the accompanying drawings in which:

FIG. 1 illustrates an example apparatus;
FIGS. 2A and 2B illustrate strain in an example apparatus;
FIGS. 3A and 3B schematically illustrate a sensor;
FIGS. 4A and 4B illustrate an apparatus;
FIGS. 5A to 5C illustrate an apparatus;
FIG. 6 illustrates cross section of an apparatus;
FIGS. 7A and 7B illustrate an apparatus;
FIGS. 8A and 8B illustrate an apparatus;
FIGS. 9A and 9B illustrate an apparatus;
FIG. 10 illustrates a method;
FIGS. 11A to 11R illustrate a method;
FIGS. 12A to 12G illustrate a method;
FIG. 13 illustrates a method;
FIGS. 14A to 14D schematically illustrate transistors;
FIGS. 15A to 15D illustrate an apparatus;
FIGS. 16A to 16F illustrate an apparatus;
FIGS. 17A to 17C illustrate an apparatus;
FIGS. 18A and 18B illustrate an apparatus;
FIG. 19 illustrates an apparatus;
FIGS. 20A to 20C illustrate an apparatus; and
FIGS. 21A to 21T illustrate an apparatus.

DETAILED DESCRIPTION

The Figures illustrate an apparatus 1 comprising: a deformable substrate 3; a curved support structure 7 configured to support at least a portion of a resistive sensor 30 wherein the resistive sensor 30 comprises a first electrode 31, a second electrode 33 and a resistive sensor material 35 provided between the electrodes 31, 33; at least one support 5 configured to space the curved support structure 7 from the deformable substrate 3 so that when the deformable substrate 3 is deformed the curved support structure 7 is not deformed in the same way; wherein the resistive sensor 30 is positioned on the curved support structure 7 so as to limit deformation of the resistive sensor 30 when the deformable substrate 3 is deformed.

The apparatus 1 may be for sensing. The apparatus 1 may be provided within a stretchable and/or deformable electronic device. The resistive sensors 30 may be configured to detect one or more physical parameters. As the resistive sensors 30 are supported by the curved support structure 7 they can be decoupled or at least partially decoupled from the deformation of the deformable substrate 3. This may enable the resistive sensors 30 to provide reliable measurements even when the apparatus 1 is deformed. This may make the apparatus 1 suitable for use in a deformable electronic device such as a wearable sensor or any other suitable device.

FIG. 1 schematically illustrates an apparatus 1 according to an example of the disclosure. The apparatus 1 illustrated in FIG. 1 comprises a deformable substrate 3, at least one support 5 and a curved support structure 7. Only features relevant to the following description have been illustrated in FIG. 1. It is to be appreciated that in other examples other features may be included. For example the apparatus 1 may be configured to be incorporated within an electronic device such as a sensor device a medical or biological sensing device, a wearable electronic device, a mobile cellular telephone or any other suitable electronic device.

In the example illustrated in FIG. 1 the deformable substrate 3 comprises a planar surface 9. In the example of FIG. 1 the planar surface 9 is flat or substantially flat. In other examples the deformable substrate 3 may have a different shape. For example it may be curved and/or the surface 9 of the deformable substrate 3 need not be flat.

The equilibrium shape of the deformable substrate 3 may be the flat configuration illustrated in FIG. 1. The equilibrium shape is the position and shape which the deformable substrate 3 will adopt when no external force is applied by the user of the apparatus 1. In other examples the deformable substrate 3 may have a different equilibrium shape, for example, the equilibrium shape may comprise at least a part of the deformable substrate 3 being bent or curved. In some examples the deformable substrate 3 may comprise both flat and curved portions.

The deformable substrate 3 may comprise at least one user-deformable portion which may be configured to change shape in response to a physical force applied by a user of the apparatus 1. The change in shape may comprise bending, folding, twisting, stretching, compression, shearing or any other suitable deformation of a portion of the deformable substrate 3. In some examples the deformable substrate 3 may be configured to automatically return to the equilibrium shape when the force applied by the user is removed.

In the example of FIG. 1 the deformable substrate 3 may be configured to be stretched in the directions indicated by the arrows 10, 12. The arrow 10 indicates the principal direction of stretch. In this example the principal direction of stretch is parallel or substantially parallel to the at least one support 5. The arrow 12 indicates a secondary direction of stretch. In this example the secondary stretch is perpendicular or substantially perpendicular to the at least one support 5.

In some examples the deformable substrate 3 may comprise a flexible substrate which may be bent or twisted by a user. The deformable substrate 3 may comprise a polymer material, elastomeric material or any other material which may be deformed in response to a force applied by the user of the apparatus 1.

In other examples the deformable substrate 3 may comprise a plurality of hinged or jointed segments. The hinged or jointed segments may be configured to be moved with respect to each other to enable a portion of the deformable substrate 3 to be folded or bent or stretched. The deformable substrate 3 may be folded or bent or stretched in response to a force applied by the user of the apparatus 1.

In some examples one or more electronic components may be mounted on the deformable substrate 3.

The apparatus 1 illustrated in FIG. 1 also comprises at least one support 5. The at least one support 5 may comprise any means which may be configured to support one or more curved support structures 7 in a position spaced from the deformable substrate 3. In the example of FIG. 1 the at least one support 5 comprises a beam 6 which extends in a direction perpendicular to the planar surface 9 of the deformable substrate 3.

In the example of FIG. 1 the at least one support 5 comprises a beam 6 which extends along a portion of the planar surface 9 of the deformable substrate 3. It is to be appreciated that other types of support may be used in other example apparatus 1. For example, the at least one support 5 may comprise a plurality of individual supports which are located separated from each other on the surface 9 of the deformable substrate 3. The plurality of individual supports may be any suitable size or shape for example, the individual supports may be square or rectangular or cylindrical or any other suitable shape. In some examples different individual supports may have different sizes and/or shapes.

In some examples the at least one support 5 may be configured to be deformable in response to a force applied by a user. For example the at least one support 5 may be configured to bend or stretch or be compressed or any other suitable deformation in response to a force applied by a user. In other examples the at least one support 5 may be configured so that it is not deformable in response to a force applied by a user. For example, the at least one support 5 may comprise a rigid material so that the at least one support 5 is not compressed when a force is applied by a user.

The at least one support 5 may be coupled to the deformable substrate 3 so that if the deformable substrate 3 is deformed this also causes movement of the at least one support 5 from its equilibrium position. For example, in the apparatus 1 illustrated in FIG. 1 the support 5 comprises a beam 6 which is mounted on the deformable substrate 3 so that it extends along a portion of the planar surface 9 of the deformable substrate 3. If the portion of the deformable substrate 3 on which the beam 6 is mounted is deformed then the beam 6 is also deformed. The deformable substrate 3 may be deformed by being stretched, twisted or bent for example so the beam 6 may also be stretched, twisted or bent. In such examples the beam 6 may comprise a flexible material such as polymeric material, elastomeric material or any other material which may be deformed in response to a force applied by the user of the apparatus 1 but which is rigid enough to support the curved support structure 7.

As mentioned above, in some examples the at least one support 5 may comprise a plurality of individual supports which are located separated from each other on the surface 9 of the deformable substrate 3 rather than a continuous beam. In such examples deforming a portion of the deformable substrate 3 will cause changing the positions or relative orientations of the respective supports 5 and need not cause a deformation of an individual support. In such examples the supports 5 may be made of any suitable material which may be configured to support the curved support structure 7.

The apparatus 1 illustrated in FIG. 1 also comprises a curved support structure 7. The curved support structure 7 may be configured to support at least a portion of a resistive sensor 30 wherein the resistive sensor 30 comprises a first electrode 31, a second electrode 33 and a resistive sensor material 35 provided between the electrodes 31, 33. Examples of resistive sensors 30 which may be supported by the curved support structure 7 are described below with reference to FIGS. 3A to 9B.

The curved support structure 7 may comprise any suitable material. In some examples the curved support structure 7 may comprise a non-conductive material. For example, the curved support structure 7 may comprise a polymer or other suitable material. In such examples the resistive sensor material 35 and the electrodes 31, 33 of the resistive sensor 30 may be mounted on the curved support structure 7.

In some examples the curved support structure 7 may comprise a conductive material. For example, the curved support structure 7 may comprise copper or other suitable material. In such examples the curved support structure may provide the first electrode 31. The resistive sensor material 35 and the second electrode 33 may be supported by the first electrode 31.

The curved support structure 7 may be coupled to the deformable substrate 3 via the at least one support 5. The at least one support 5 is configured to separate the curved support structure 7 from the substrate so that the curved support structure 7 is, at least partially, isolated from the deformable substrate 3. The at least one support 5 is positioned between the curved support structure 7 and the deformable substrate 3. The at least one support 5 may maintain the curved support structure 7 in a position which is spaced from the deformable substrate 3 so that the curved support structure 7 and the deformable substrate 3 are separated from each other. The distance of the separation between the curved support structure 7 and the deformable substrate 3 may be dependent on the height of the at least one support 5. In the example of FIG. 1 the distance of the separation between the curved support structure 7 and the deformable substrate 3 is the same as the height of the beam 6.

In some examples the curved support structure 7 and the at least one support 5 may be configured so that the curved support structure 7 does not directly contact the deformable substrate 3. In some examples the curved support structure 7 and the at least one support 5 may be configured so that the curved support structure 7 does not directly contact the deformable substrate 3 when the apparatus 1 is in an equilibrium, non-deformed state. In some examples the curved support structure 7 and the at least one support 5 may be configured so that the curved support structure 7 does not directly contact the deformable substrate 3 when the apparatus 1 is in a deformed state.

In the example of FIG. 1 the curved support structure 7 comprises an elongate member 11 which is coupled to the at least one support 5 at a plurality of different points along the length of the elongate member 11.

The elongate member 11 is curved. The elongate member 11 may comprise a plurality of curves. The total length of the elongate member 11 is greater than the length of the deformable substrate 3 over which the elongate member 11 extends. The curved portion 16 of the elongate member 11 has an angle of curvature greater than 180 degrees so that the elongate member 11 doubles back on itself to form a loop 13. The loop 13 comprises an opening 14 so the loop 13 is not closed. In the example of FIG. 1 the elongate member 11 comprises a plurality of loops 13. The plurality of loops 13 form a serpentine shape in which a loop 13 which extends to the left hand side of the beam 6 is followed by a loop 13 which extends to the right hand side of the beam 6. The elongate member 11 is configured so that the curved support structure 7 is distributed on either side of the beam 6.

The curved support structure 7 may be coupled to the at least one support 5 at a plurality of different points along the length of the elongate member 11. In the example of FIG. 1 the curved support structure 7 is coupled to the beam 6 at two points in each loop 13.

It is to be appreciated that the shape of the curved support structure 7 illustrated in FIG. 1 is an example and other shapes could be used in other examples.

In the example of FIG. 1 only one curved support structure 7 is illustrated. In some examples the apparatus 1 may comprise a plurality of curved support structures 7. The curved support structures 7 may extend in the same direction along the deformable substrate 3.

In some examples additional curved structures may be provided overlaying the curved support structures 7. The additional curved structures may extend in a direction perpendicular or substantially perpendicular to the curved support structure 7. Examples of apparatus 1 comprising curved support structures 7 and additional curved structures are described below with reference to FIGS. 7A to 9B.

FIGS. 2A and 2B show the first principal strain on the surface of two example curved support structures 7. FIG. 2A shows the first principal strain for a polymer curved support structure 7 and FIG. 2B shows the first principal strain for a metal curved support structure 7. In FIG. 2B copper was used as the metal.

To obtain the results illustrated in FIGS. 2A and 2B a strain of 20% was applied to the apparatus 1. The maximum strain observed in the curved support structure 7 is observed at the edges of the curved support structure 7. The maximum strain observed is only +/−0.5% which is two orders of magnitude smaller than the strain which is applied to the apparatus 1. It can be seen from FIGS. 2A and 2B that very little strain is present in the curved support structures 7 even when a large strain is applied to the apparatus 1. Close to the centre of the conductive support structure 7 the strain is zero or very close to zero.

In examples of the disclosure the curved support structure 7 is configured to support at least a portion of a resistive sensor 30 so that the resistive sensor 30 is subjected to a reduced strain when the apparatus 1 is deformed. In some examples the resistive sensor 30 may comprise a transistor 161.

FIGS. 3A and 3B schematically illustrate resistive sensors 30 which may be used in examples of the disclosure. The resistive sensor 30 comprises a first electrode 31 and second electrode 33 and resistive sensor material 35. The resistive sensor material 35 forms an electrical connection between the electrodes 31, 33. The resistive sensor material 35 may provide a direct current path between the two electrodes 31, 33.

The electrodes 31 and 33 may comprise any conductive material. For examples the electrodes 31, 33 may comprise copper, silver, gold, graphene, indium tin oxide (ITO) or any other suitable material.

The resistive sensor material 35 may comprise a material which has a variable resistance. The resistive sensor material 35 may have a resistance which varies in dependence on the presence of a parameter which is sensed by the resistive sensor material 35. The sensed parameter may comprise an environmental parameter such as a chemical which may be present in the environment around the resistive sensor 30 or any other physical parameter which may be detected such as temperature or light.

The resistive sensor material 35 may have a resistive transduction mechanism so that the resistivity of the resistive sensor material 35 changes in response to the parameter to be sensed. The material which is used as the resistive sensor material 35 may be determined by the parameter which is to be sensed.

In some examples the resistive sensor material 35 may be used to enable the resistive sensor 30 to detect humidity. In such examples the resistive sensor material 35 may comprise a material such as graphene oxide.

In some examples the resistive sensor material 35 may be configured to detect changes in temperature. Examples of the resistive sensor material 35 which may be used in such examples include Silicon Carbide or any other suitable material.

In some examples the resistive sensor material 35 may comprise a photoresitive material which may enable the resistive sensor 30 to be used to detect the ambient light.

FIG. 3A schematically illustrates an example arrangement resistive sensor 30 which may be used in examples of the disclosure where the resistive sensor material 35 has a high sheet resistance. In such examples the distance d between the electrodes 31, 33 may be small and the length of the electrodes 31, 33 l may be large. This gives a low separation to length d/l ratio for the resistive sensor 30. The example resistive sensor 30 arrangement of FIG. 3A may be used with a resistive sensor material 35 such as graphene oxide which has a sheet resistance of around 5 GΩ/sq at 50 nm when the graphene oxide is 50 nm thick.

FIG. 3B schematically illustrates an example arrangement resistive sensor 30 which may be used in examples of the disclosure where the resistive sensor material 35 has a low sheet resistance. In such examples the distance d between the electrodes 31, 33 may be large and the length of the electrodes 31, 33 l may be small. This gives a high separation to length d/l ratio for the sensor 30. The example resistive sensor 30 arrangement of FIG. 3A may be used with a resistive sensor material 35 such as a thermistor paste which may have a sheet resistance of 5 Ω/sq.

FIGS. 4A to 9B show example apparatus 1 in which a resistive sensor 30 is supported by a curved support structure 7.

FIGS. 4A and 4B illustrate an example apparatus 1 according to an example of the disclosure. FIG. 4A illustrates a plan view of an apparatus 1 and FIG. 4B illustrates a cross section through a portion of the apparatus 1. The example apparatus 1 comprises a curved support structure 7 and at least one support 5 which may be as described above in relation to FIG. 1. The curved support structure 7 supports a resistive sensor 30.

In the example of FIGS. 4A and 4B the curved support structure 7 comprises a non-conductive material. In the example of FIGS. 4A and 4B the curved support structure 7 comprises a polymer material. In other examples other materials may be used.

In the example of FIGS. 4A and 4B the curved support structure 7 supports the first electrode 31, the second electrode 33 and the resistive sensor material 35 of the resistive sensor 30. The first electrode 31 is provide on a first edge 41 of the curved support structure 7 and a second electrode 33 is provided on a second edge 43 of the curved support structure 7.

The resistive sensor material 35 is provided between the two electrodes 31, 33. The resistive sensor material 35 provides an electrical connection between the two electrodes 31, 33. In the example of FIGS. 4A and 4B the resistive sensor material 35 is provided in the centre portions of the curved support structure 7. This may be the region of the curved support structure 7 which undergoes the least strain. This may minimise the strain within the resistive sensor material 35 when the apparatus 1 is deformed.

In the example of FIGS. 4A and 4B the electrodes 31, 33 extend along the length of the curved support structure 7. The electrodes 31, 33 are arranged to have low separation to length d/l ratio. The example resistive sensor 30 arrangement of FIGS. 4A and 4B may be used with a resistive sensor material 35 which has a high sheet resistance.

FIGS. 5A to 5C illustrate an example apparatus 1 according to another example of the disclosure. FIG. 5A illustrates a plan view of an apparatus 1. FIG. 5B illustrates a cross section through a portion of the apparatus 1 in which the curved support structure 7 comprises a conductive material. FIG. 5C illustrates a cross section through a portion of the apparatus 1 in an alternative example in which the curved support structure 7 comprises a non-conductive material. The example apparatus 1 comprises a curved support structure 7 and at least one support 5 which may be as described above in relation to FIG. 1. The curved support structure 7 supports at least a portion of a resistive sensor 30.

In the example of FIG. 5B the curved support structure 7 comprises a conductive material. In this example the curved support structure 7 provides the first electrode 31. The curved support structure 7 may comprise any suitable material such as copper or other conductive material.

In the example of FIG. 5B the first electrode 31 supports the resistive sensor material 35 and the second electrode 33. The resistive sensor material 35 and the second electrode 33 may be deposited directly on the first electrode 31. The resistive sensor material 35 may be provided as a layer overlaying the first electrode 31. The second electrode 33 may be provided in a layer overlaying resistive sensor material 35. The resistive sensor material 35 may be provided between the first electrode 31 and the second electrode 33 to provide an electrical connection between the two electrodes 31, 33.

In the example of FIG. 5B the material and thickness of the material which is used as the first electrode 31 is selected to enable the weight of the resistive sensor material 35 and the second electrode 33 to be supported by the first electrode 31.

The cross section of FIG. 5C shows an alternative arrangement for a resistive sensor 30. In the example of FIG. 5C the curved support structure 7 comprises a non-conductive material such as a polymer material. In other examples other materials may be used. In the example of FIG. 5C the curved support structure 7 supports the first electrode 31, the second electrode 33 and the resistive sensor material 35. The first electrode 31 is provided as a first layer on the curved support structure 7. The resistive sensor material 35 is provided as a layer overlaying the first electrode 31. The second electrode 33 is provided in a layer overlaying the resistive sensor material 35. The resistive sensor material 35 provides an electrical connection between the two electrodes 31, 33.

In the examples of FIGS. 5A to 5C the resistive sensor material 35 is deposited across the width of the curved support structure 7. The resistive sensor material 35 may cover the centre portion of the curved support structure 7 and the edges of the curved support structure 7. The strain which is present in the curved support structure 7 when the apparatus 1 is deformed may be low enough so that it does not affect the resistive sensor material 35.

In the examples of FIGS. 5A to 5C the second electrode 33 is provided as three strips 51 overlaying the resistive sensor material 35. The strips 51 do not completely cover the resistive sensor material 35. This enables the resistive sensor 30 to be permeable to the parameter which is to be sensed by the resistive sensor material 35. It is to be appreciated that in other examples other arrangements may be used to provide gaps in the second electrode 33.

In some examples the second electrode 33 may be continuous with no gaps. In such examples the second electrode 33 may be arranged to be permeable to the parameter which is to be sensed by the resistive sensor material 35. For example an optically transparent material such as indium tin oxide (ITO) may be provided overlaying a resistive sensor material 35 which is configured to detect incident light.

In the example of FIGS. 5A to 5C the electrodes 31, 33 extend along the length of the curved support structure 7 so that the electrodes 31, 33 have low separation to length d/l ratio. The example resistive sensor 30 arrangement of FIGS. 5A to 5C may be used with a resistive sensor material 35 which has a high sheet resistance.

The example resistive sensor 30 of FIGS. 4A to 5C may be used with a resistive sensor material 35 such as graphene oxide which may be configured to detect humidity. Such resistive sensors 30 may be used to provide a stretchable humidity sensor device. The device could be worn as a patch on the body of a user and may be used to measure levels or perspiration or other biological parameters.

FIG. 6 illustrates a cross section of an example apparatus 1. The apparatus 1 comprises a deformable substrate 3, at least one support 5 and a curved support structure 7 which may be as described in relation to FIG. 1. The cross section may be taken perpendicular to the principal direction of strain in FIG. 1. The curved support structure 7 may support a resistive sensor 30 or a plurality of resistive sensors 30.

The deformable substrate 3 comprises a lower portion 61 and an upper portion 63. The deformable substrate 3 forms a cavity 69 in which the curved support structure 7 and the resistive sensor 30 or plurality of resistive sensors 30 are provided.

In the example of FIG. 6 additional support pillars 65 are provided between the upper portion 63 of the deformable substrate 3 and the lower portion 61 of the deformable substrate 3. The additional support pillars 65 may be formed from the same material as the deformable substrate 3. The additional support pillars 65 may be configured to prevent the upper portion 63 of the deformable substrate 3 from coming into contact with the curved support portion 7 when the apparatus 1 is deformed.

The upper portion 63 of the deformable substrate 3 comprises one or more vent holes 67. The vent holes 67 may be configured to enable the environmental parameters which are to be detected to pass through the upper portion 63 of the deformable substrate 3 and reach the resistive sensor 30. In some examples the vent holes 67 may comprise gaps or discontinuities in the upper portion 63 of the deformable substrate 3. In other examples the vent holes 67 may comprise portions of the upper portion 63 of the deformable substrate 3 which are permeable to an environmental parameter which is to be detected.

FIGS. 7A and 7B illustrate an example of an apparatus 1 comprising an array 71 of resistive sensors 30. The array 71 of resistive sensors 30 may comprise a plurality of resistive sensors 30. In some examples different resistive sensors 30 within the array 71 may be configured to sense different parameters. In such examples different resistive sensor materials 35 may be used in different resistive sensors 30.

FIG. 7A illustrates a plan of a section of the apparatus 1. FIG. 7B provides an equivalent circuit diagram for a three by three array 71 of resistive sensors 30. It is to be appreciated that the array 71 of resistive sensors 30 may comprise any suitable number of resistive sensors 30 in any suitable arrangement.

The apparatus 1 of FIGS. 7A and 7B comprise a deformable substrate 3, at least one support 5 and a curved support structure 7 which may be as described in relation to FIG. 1. Only one curved support structure 7 is illustrated in FIG. 7A however it is to be appreciated that the apparatus 1 may comprise a plurality of curved support structures 7. The plurality of curved support structures 7 may extend in the same direction.

In the example of FIGS. 7A and 7B the apparatus 1 also comprises a plurality of additional curved structure 75. The additional curved structures 75 may comprise an elongate member 11. The elongate member 11 may form a serpentine shape. The serpentine shape may be the same or similar to the serpentine shape of the curved support structure 7.

The additional curved structures 75 extend in a direction perpendicular to the curved support structures 7. The additional curved structures 75 are provided spaced along the length of the curved support structures 7 so that there are a plurality of intersecting points where an additional curved structure 75 crosses over a curved support structure 7.

The additional curved structures 75 are provided overlaying the curved support structures 7. The additional curved structures 75 may comprise an electrical connection to the second electrode 33. The additional curved structures 75 provide cross connectors for the array 71 of resistive sensors 30.

The example apparatus 1 of FIGS. 7A and 7B uses a resistive sensor 30 arrangement as illustrated in FIGS. 4A and 4B and described above. The electrodes 31, 33 are provided on the edges 41, 43 of the curved support structure 7 and the resistive sensor material 35 is provided between the electrodes 31, 33. The resistive sensors 30 are provided in sections along the length of the curved support structure 7.

The length of the sections of resistive sensors 30 can be selected to control the sensitivity of the resistive sensors 30. The length of the discontinuous electrode 33 and/or the thickness of the resistive sensor material 35 may be adjusted to tune the resistance of the resistive sensor 30.

A dielectric insulating material 73 is provided between the first electrode 31 and the additional support structure 75. The dielectric insulating material 73 may be configured to prevent a direct connection between the first electrode 31 and the cross connector.

FIGS. 8A and 8B illustrate another example of an apparatus 1 comprising an array 71 of resistive sensors 30. As in FIGS. 7A and 7B the array 71 of resistive sensors 30 may comprise a plurality of resistive sensors 30. Different resistive sensors 30 within the array 71 may be configured to sense different parameters. In such examples different resistive sensor materials 35 may be used in different resistive sensors 30.

FIG. 8A illustrates a plan of a section of the apparatus. FIG. 8B provides an equivalent circuit diagram for a three by three array 71 of resistive sensors 30. It is to be appreciated that the array 71 of resistive sensors 30 may comprise any suitable number of resistive sensors 30 in any suitable arrangement.

The apparatus 1 of FIGS. 8A and 8B comprise a deformable substrate 3, at least one support 5 and a curved support structure 7 which may be as described in relation to FIG. 1. Only one curved support structure 7 is illustrated in FIG. 8A however it is to be appreciated that the apparatus 1 may comprise a plurality of curved support structures 7. The plurality of curved support structures 7 may extend in the same direction.

In the example of FIGS. 8A and 8B the apparatus 1 also comprises a plurality of additional curved structure 75. The additional curved structures may comprise an elongate member 11. The elongate member 11 may form a serpentine shape. The serpentine shape may be the same or similar to the serpentine shape of the curved support structure 7.

The additional curved structures 75 extend in a direction perpendicular to the curved support structures 7. The additional curved structures 75 are provided spaced along the length of the curved support structures 7 so that there are a plurality of intersecting points where an additional curved structure 75 crosses over a curved support structure 7.

The additional curved structures 75 are provided overlaying the curved support structures 7. The additional curved structures 75 may comprise an electrical connection to the second electrode 33. The additional curved structures 75 provide cross connectors for the array 71 of resistive sensors 30.

The example apparatus 1 of FIGS. 8A and 8B uses a resistive sensor 30 arrangement as illustrated in FIGS. 5A to 5C and described above. The first electrode 31 is provided underneath the resistive sensor material 35 and so is not illustrated in the plan view of FIG. 8A. The resistive sensors 30 are provided in sections along the length of the curved support structure 7.

The length of the sections of resistive sensors 30 and the width of the discontinuous electrode 33 and/or the thickness of the resistive sensor material 35 may be adjusted to tune the resistance of the resistive sensor 30.

The information obtained by the sensors may be read using any suitable means. In the examples of FIGS. 7A to 8D each of the resistive sensors 30 within the array 71 may be read independently by multiplexing read electronics.

FIGS. 9A and 9B illustrate an example apparatus 1 according to another example of the disclosure. The example apparatus 1 of FIGS. 9A and 9B may be suitable for a user with a resistive sensor material 35 with a low sheet resistance. FIG. 9A illustrates a plan view of an apparatus 1 and FIG. 9B illustrates a cross section through a portion of the apparatus 1. The example apparatus 1 comprises a curved support structure 7 and at least one support 5 which may be as described above in relation to FIG. 1. Only one curved support structure 7 is illustrated in FIG. 9A however it is to be appreciated that the apparatus 1 may comprise a plurality of curved support structures 7.

The example apparatus 1 of FIGS. 9A and 9B also comprise a plurality of additional curved structure 75. Two additional curved structures 75 are illustrated in FIG. 9A however it is to be appreciated that any number may be provided within the apparatus 1.

In the examples of FIGS. 9A and 9B the additional curved structures 75 comprise an elongate member 11 in a serpentine shape. The serpentine shape of the additional curved structure 75 may be the same or similar to the serpentine shape of the curved support structure 7.

The additional curved structures 75 extend in a direction perpendicular to the curved support structures 7. The additional curved structures 75 are provided spaced along the length of the curved support structures 7 so that there are a plurality of intersecting points where an additional curved structure 75 crosses over a curved support structure 7.

The additional curved structures 75 are provided overlaying the curved support structures 7. In the example apparatus of FIGS. 9A and 9B the additional curved structure 75 may provide second electrode 33 for one or more resistive sensors 30.

In the example of FIGS. 9A and 9B the curved support structure 7 comprises a non-conductive material. In the example of FIGS. 9A and 9B the curved support structure 7 comprises a polymer material. In other examples other materials may be used.

In the example of FIGS. 9A and 9B the first electrode 31 is provided as a layer underneath the curved support structure 7. The first electrode 31 may extend along the length of the curved support structure 7. The first electrode 31 may extend continuously along the length of the curved support structure 7.

The resistive sensor material 35 is provided as a layer overlaying the curved support structure 7. The resistive sensor material 35 may extend along the length of the curved support structure 7. In some examples the resistive sensor material 35 may be provided covering the whole width of the curved support structure 7. In some examples the resistive sensor material 35 may only be provided on the portions of the curved support structure 7 which are subjected to the lowest amount of strain when the apparatus 1 is deformed. For example the resistive sensor material 35 might only be provided in the central portion of the curved support structure 7. This may enable materials which are very sensitive to strain to be used as the resistive sensor material 35.

The second electrode 33 is provided by the additional support structure 75. A via 91 is provided through the curved support structure 7 to enable the resistive sensor material 35 to electrically connect the first and second electrodes 31, 33. The via 91 may be provided at points along the curved support structure 7 which are subjected to the lowest amount of strain when the apparatus 1 is deformed.

In the example of FIGS. 9A and 9B the first electrode 31 is provided on the curved support structure 7 while the second, cross connector electrode 33 is provided on an additional support structure 75 and the resistive sensor material 35 extends along the length of the support structure 7. The resistance is measured between the position of the via 91 and the cross connector electrode 33. This arrangement gives the resistive sensor 30 a high separation to length d/l ratio. The example resistive sensor 30 arrangement of FIGS. 9A and 9B may be used with a resistive sensor material 35 which has a low sheet resistance. For example the apparatus of FIGS. 9A and 9B may be used with a material such as Silicon Carbide which may be used to detect changes in temperature.

It is to be appreciated that a plurality of sensors 30 as illustrated in FIGS. 9A and 9B may be provided in an array 71. The equivalent circuit diagram may be the same as FIG. 8B. Each of the resistive sensors 30 within the array 71 may be read independently by multiplexing read electronics.

FIGS. 10 to 13 illustrate example methods which may be used to provide apparatus 1 according to examples of the disclosure. The apparatus 1 may be as described above with regards to FIGS. 1 to 9B.

FIG. 10 illustrates a first example method. The method comprises, at block 101, providing a deformable substrate 3. The method comprises, at block 103, providing a curved support structure 7. The curved support structure 7 is configured to support at least a portion of a resistive sensor 30 wherein the resistive sensor 30 comprises a first electrode 31, a second electrode 33 and a resistive sensor material 35 provided between the electrodes 31, 33. The method also comprises, at block 105, providing at least one support 5 configured to space the curved support structure 7 from the deformable substrate 3 so that when the deformable substrate 3 is deformed the curved support structure 7 is not deformed in the same way. The resistive sensor 30 is positioned on the curved support structure 7 so as to limit deformation of the resistive sensor 30 when the deformable substrate 3 is deformed.

FIGS. 11A to 11R also illustrate an example method of providing an apparatus 1. The example method of FIGS. 11A to 11R may be used to provide an apparatus 1 such as the apparatus 1 of FIGS. 4A and 4B and 7A and 7B.

In FIG. 11A a release layer 111 is deposited on a silicon wafer 113. In FIG. 11B a photoresist layer 115 is deposited on the release layer 111. The photoresist layer 115 is patterned as an electrode 33. In FIG. 11C a conductive material 117, such as metal, is deposited on the photoresist layer 115. The conductive material 117 may be deposited using any suitable means such as evaporation or sputtering. In FIG. 11D the photoresist layer 115 is removed and the electrode 33 is left on the release layer 111.

In the example of FIGS. 11B to 11D the electrode 33 which is formed may provide the second electrode 33 as illustrated in FIGS. 7A and 7B. This electrode 33 may comprise part of an additional curved structure 75 and extend along a portion of a curved support structure 7.

Figures 11E, 11F, 11G, 11H:
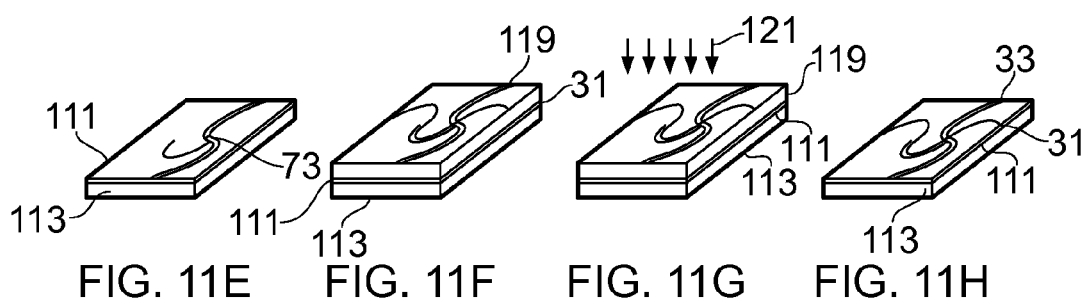

In FIG. 11E dielectric insulating material 73 is deposited on the electrode 33. The dielectric insulating material 73 may be deposited using any suitable means such as inkjet printing or screen printing. In FIG. 11F another photoresist layer 119 is deposited on the release layer 111. The photoresist layer 119 is patterned as another electrode 31. In FIG. 11G a conductive material 121, such as metal, is deposited on the photoresist layer 119. The conductive material 121 may be deposited using any suitable means such as evaporation or sputtering. In FIG. 11H the photoresist layer 119 is removed and the two electrodes 31, 33 are left on the release layer 111.

The electrode 31 which is formed in the blocks of the method of FIGS. 11F to 11H may form the first electrode 31 as illustrated in FIGS. 7A and 7B. This electrode 31 may be arranged to extend along a portion of a curved support structure 7.

Figures 11I, 11J, 11K:
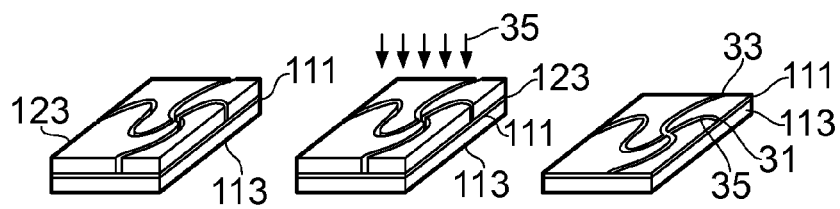

In FIG. 11I another photoresist layer 123 is deposited on the release layer 111. The photoresist layer 123 is patterned as the resistive sensor material 35. In FIG. 11J a resistive sensor material 35 is deposited on the photoresist layer 123. The resistive sensor material 35 may be any material which has a resistance which varies in response to a sensed parameter. The resistive sensor material 35 may be deposited using any suitable means such as evaporation, sputtering, screen printing or any other suitable means. The method used may to deposit the resistive sensor material 35 may depend on the material which is used. As an example, graphene oxide could be bar coated or spray coated from a solution. In FIG. 11K the photoresist layer 123 is removed and the resistive sensor material 35 is left between the two electrodes 31, 33.

Figures 11L, 11M, 11N:
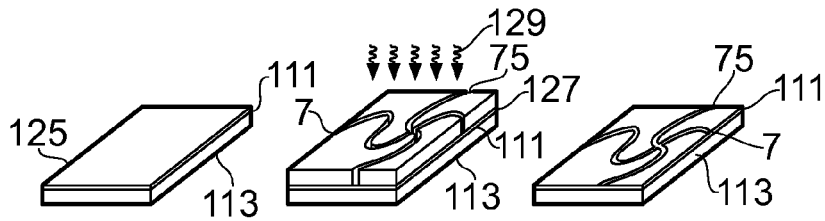
Figures 11O, 11P, 11Q, 11R:
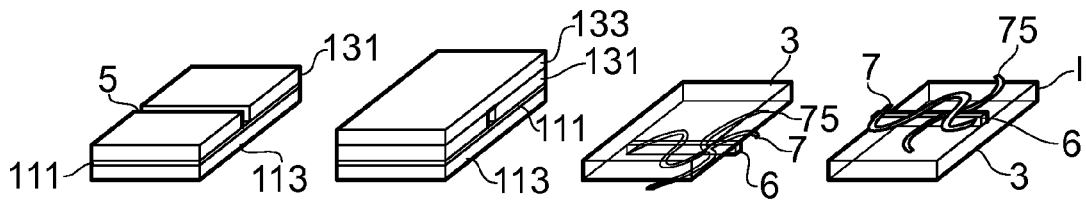

In FIG. 11L a polymer 125 is deposited onto the electrodes 31, 33. The polymer 125 may be a photopatternable polymer. The polymer 125 may be spin coated onto the electrodes 31, 33. In other examples other means for depositing the polymer 125 may be used. In FIG. 11M another photoresist layer 127 is deposited on the polymer 125. The photoresist layer 127 is patterned as the curved support structure 7 and the additional curved structure 75. The polymer 125 is then exposed to ultra-violet (UV) light 129. The UV light 129 hardens the polymer 125 which is exposed to the UV light by increasing the number of crosslinks in the polymer 125. The portions of the polymer 125 which are not exposed to UV light 129 remain as uncrosslinked polymer 125. In FIG. 11N the photoresist layer 127 and the uncrosslinked polymer are removed. This leaves the curved support structure 7 and additional curved support structure 75.

In FIG. 11O a further photoresist layer 131 is deposited. The further photoresist layer 131 is patterned as the at least one support 5. In the example of FIG. 11O the at least one support 5 comprises a beam 6. In FIG. 11P an elastomer layer 133 is cast against the further photoresist layer 131 and cured. In FIG. 11Q the further photoresist layer 131 and the lift off layer 111 are removed leaving a deformable substrate 3, beam 6 and curved support structure 7. In FIG. 11R the structure is inverted to leave an apparatus 1 as described above and illustrated in FIGS. 7A and 7B.

It is to be appreciated that the method of FIGS. 11A to 11R could be modified to provide different examples apparatus 1. For instance the method could be modified to provide an example apparatus 1 with stacked electrodes 31, 33 as in FIGS. 8A and 8B. In such examples the block of FIG. 11E could be removed as no dielectric insulating material 73 is needed. The blocks of FIGS. 11I to 11K could be switched with the blocks of FIGS. 11F to 11H so that the resistive sensor material 35 is provided as a layer between the two electrodes 31, 33. The shapes of the electrodes 31, 33 and the resistive sensor material 35 could be adjusted accordingly.

The method could also be modified to provide an example apparatus 1 which may use a resistive sensor material 35 with a low sheet resistance. For instance the method could be modified to provide an apparatus 1 such as the apparatus of FIGS. 9A and 9B. In such examples the block of FIG. 11E could be removed as no dielectric insulating material 73 is needed. The blocks of FIGS. 11F to 11H could be switched with the blocks of FIGS. 11I to 11N so that the curved support structure 7 is provided between the electrodes 31, 33. The mask used to produce the curved support structure 7 may be modified to enable the vias 91 to be added.

FIGS. 12A to 12G show a method for producing part of an apparatus 1 such as the apparatus 1 illustrated in FIG. 6. In FIG. 12A a photoresist layer 141 is deposited onto a silicon substrate 143. The photoresist layer 141 may be spin coated onto the silicon substrate 143. Other means of depositing a photoresist layer 141 may be used in other examples of the disclosure.

In FIG. 12B the layer of photoresist 141 is patterned as vent holes 67. The vent holes 67 may be arranged in any suitable pattern. In FIG. 12C an elastomer layer 145 is cast against the photoresist layer 141 and cured. This elastomer layer 145 may form part of an upper portion 63 of a deformable substrate 3.

In. FIG. 12D a second photoresist layer 147 is deposited over the elastomer layer 145. The second photoresist layer 147 may be spin coated onto the elastomer layer 145 or any other suitable means may be used. In FIG. 12E the photoresist layer 147 is patterned as additional support pillars 65. In FIG. 12F another elastomer layer 149 is cast against the second photoresist layer 147 and cured. This elastomer layer 149 may form the additional support pillars 65 as described above with reference to FIG. 6.

In FIG. 12G the second photoresist layer 147 is removed leaving an upper portion 63 of a deformable substrate 3 with vents 67 and additional support pillars 65.

FIG. 13 illustrates an example method which may be used to combine the upper portion 63 of a deformable substrate 3 with the lower portion 61 of the deformable substrate 3. The upper portion 63 of the deformable substrate 3 may be formed as described with relation to FIGS. 12A to 12G. The lower portion 61 of the deformable substrate 3 may be formed as described with relation to FIGS. 11A to 11R. The lower portion 61 of the deformable substrate 3 may comprise a curved support structure 7 and resistive sensors 30.

In the example of FIG. 13 the upper portion 63 and the lower portion 61 are bonded in a roll-to-roll process after brief plasma treatment to promote bonding.

In some examples the resistive sensors 30 may comprise one or more transistors 161. The transistors 161 may be configured to act as sensors. In some examples the one or more of the transistors 161 may be configured to act as switches and/or as amplifiers.

In some examples the transistors 161 may comprise field effect transistors (FET). The FETs may use an electric field to control the conductivity of a channel within an active material. The FET may be fabricated in thin film form. For examples the FET may be a thin film transistor (TFT), in which thin films of an active material, dielectric and electrodes are deposited over a supporting substrate. The TFT may suitable for use in deformable apparatus 1 as the thickness of the TFT may be configured to allow deformations such as bending and stretching. The TFT may also be configured with a high surface area-to-volume ratio of the active material. This may make the TFT suitable for use as a sensor.

FIGS. 14A to 14D schematically illustrate example arrangements for transistors 161 which may be used in some examples of the disclosure. Each of the transistors 161 comprises a source electrode 162, a drain electrode 163 and a gate electrode 164. The transistors 161 also comprise a dielectric material 165 positioned between the gate electrode 164 and the source and drain electrodes 162, 163. The transistors 161 also comprise an active material 166 which is positioned between the source and drain electrodes 162, 163. The transistors 161 may be provided on a substrate 167.

Figures 14A, 14B, 14C, 14D:
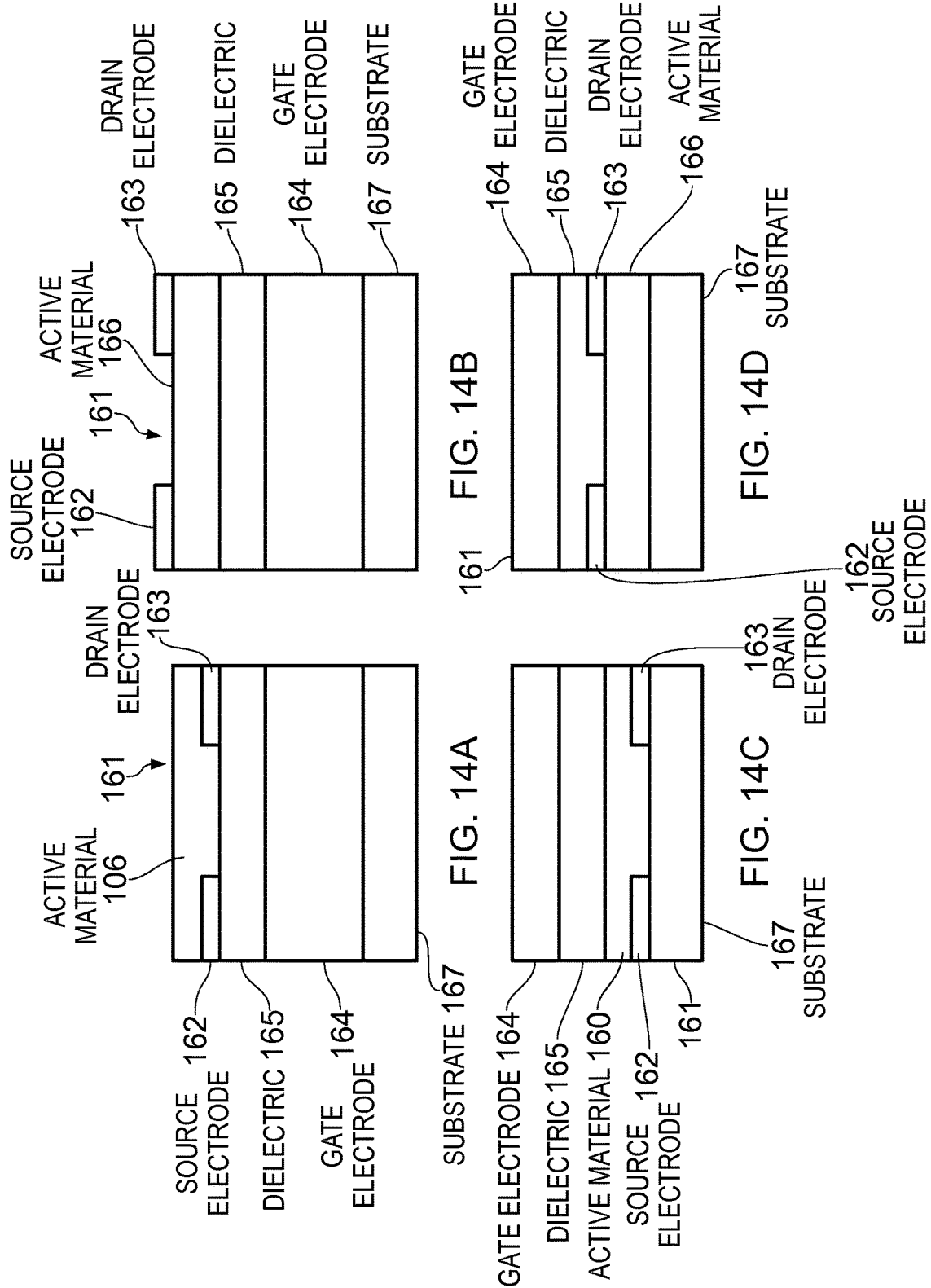

FIGS. 14A to 14D schematically illustrate four different example arrangements for transistors 161. Each of the different example arrangements may provide different performance due to differences in contact resistances and parasitic capacitance. FIG. 14A illustrates a bottom gate-bottom contact transistor 161 arrangement. FIG. 14B illustrates a bottom gate-top contact transistor 161 arrangement. FIG. 14C illustrates a top gate-bottom contact transistor 161 arrangement. FIG. 14D illustrates a top gate-top contact transistor 161 arrangement.

The active material 166 may comprise a semiconductor or a semiconductor with an active layer. In some examples the active material 166 may be configured to be responsive to a parameter which is to be sensed. This may enable the transistor 161 to be used as a sensor.

The material which is used as the active material 166 may depend on the parameter which is to be sensed. In some examples the apparatus 1 may comprise a plurality of different transistors 161 which may be configured to sense different parameters. Table 1 lists example materials which may be used as active materials 166 within transistors 161 and the parameters which they may be used to sense. It is to be appreciated that other materials may be used in other examples of the disclosure.

| Active material | Parameter |
| --- | --- |
| Graphene with quantum dot activation layer | Electromagnetic radiation which may include ultraviolet (UV) and/or infra red (IR) wavelength light |
| Graphene with antibody activation | Antigens such as Lyme antigen B. borrelia, cancers |
| Graphene | Gasses or other contaminants |
| ZnO + DNA aptamers | pH, biomolecules |
| Poly-Si | Temperature |
| Pentacene with polyvinylidene difluoride (PVDF) susbstrate | IR heat, strain |
| PII2T-Si (polyisoindigo-based polymer with siloxane-containing solubilizing chains) | $Hg^{2+}$ contamination |
| Pentacene | Humidity |
| C12FTTF | Humidity |
| C6TFT | Humidity |
| P3HT with activation layers ($Ta_2O_5$, valinomycin, arachidic acid, $Ta_2O_5$ + GOx etc.) | pH, Ions, glucose, DNA, vanillin |
| PEDOT:PSS and GOx | Glucose |
| CuPc (copperphthalocyanine) | Lactic acid, pyruvic acid |
| NiPc (nickelphthalocyanine) | $O_3$ |
| DDFTTF (5,50-bis-(7-dodecyl-9H-fluoren-2-yl)-2,20-bithiophene) | pH, Glucose, DNA, Cysteine |

In some examples the transistor 161 may also comprise a passivation layer. The passivation layer may be configured to prevent contaminants from contacting components of the transistor and may prevent degradation of the transistor 161. The material which is used as the passivation layer may depend on the parameter which is being sensed and the material which is used as the active material 166.

FIGS. 15A to 20 illustrate example apparatus 1 in which transistors 161 are configured to be supported by a curved support structure 7.

FIGS. 15A to 15D illustrate an example apparatus 1 comprising a transistor 161 according to an example of the disclosure. FIG. 15A illustrates a plan view of an apparatus 1. FIG. 15B illustrates a cross section through a portion of the apparatus 1 in which the transistor 161 is located. FIG. 15C illustrates a detailed top view of the portion of the apparatus 1 in which the transistor 161 is located. FIG. 15D illustrates a side view of a portion of the apparatus 1 in which the transistor 161 is located. The example apparatus 1 comprises a curved support structure 7 and at least one support 5 which may be as described above. The curved support structure 7 may be configured to support components of the transistor 161.

In the example of FIGS. 15A to 15D the curved support structure 7 comprises a conductive material. The conductive material may comprise a metallic material such as copper or any other suitable material. The conductive curved support structure 7 may be configured to provide the gate electrode 164 for the transistor 161.

In the example of FIGS. 15A to 15D the transistor 161 is arranged in a bottom gate-top contact arrangement. In the example of FIGS. 15A to 15D the conductive curved support structure 7 provides the gate electrode 164 and also supports the source electrode 162 and the drain electrode 163. The source electrode 162 is provided on a first edge 41 of the conductive curved support structure 7 and the drain electrode 163 is provided on a second edge 43 of the curved support structure 7. In the example of FIGS. 15A to 15D the electrodes 162, 163 extend along the length of the conductive curved support structure 7. This may be similar to the first and second electrodes 31, 33 of the resistive sensor 30 arrangements described above.

The curved support structure 7 is also configured to support the active material 166. In the example of FIGS. 15A to 15D the active material 166 comprises a semiconductor. The active material 166 is provided between the two electrodes 162, 163. The active material 166 provides a channel between the two electrodes 162, 163. In the example of FIGS. 15A to 15D the active material 166 is provided in the centre portions of the curved support structure 7. This may be the region of the curved support structure 7 which undergoes the least strain. This may minimise the strain within the active material 166 when the apparatus 1 is deformed. In the example of FIGS. 15A to 15D the active material 166 is provided in the apex of one of the loops 13 of the curved support structure 7. It is to be appreciated that in other examples the active material 166 may be provided in other positions along the curved support structure 7.

The conductive curved support structure 7 is also configured to support the dielectric material 165. The dielectric 165 may be deposited on the curved support structure 7 to prevent electrical contact between the gate electrode 164 and the source and drain electrodes 162, 163 and the active material 166. In the example of FIGS. 15A to 15B the dielectric material 164 covers the surface of the conductive curved support structure 7.

It is to be appreciated that the transistor 161 could be provided in other arrangements in other examples of the disclosure. For instance the order of deposition of the layers of the transistor 161 may be altered to provide bottom contact arrangements.

FIGS. 16A to 16F illustrate example apparatus 1 comprising a transistor 161 according to other examples of the disclosure. In the examples of FIGS. 16A to 16F the curved support structure 7 comprises a non-conductive material.

FIG. 16A illustrates a plan view of an apparatus 1. FIG. 16B illustrates a cross section through a portion of the apparatus 1 in which the transistor 161 is located. FIG. 16C illustrates a side view of a portion of the apparatus 1 in which the transistor 161 is located. The example apparatus 1 comprises a curved support structure 7 and at least one support 5 which may be as described above. The curved support structure 7 may be configured to support components of the transistor 161.

In the example of FIGS. 16A to 16C the curved support structure 7 comprises a non-conductive material. The non-conductive material may comprise a polymer material such as polyimide, Flourinated polyimide, Methylsilsesquioxane, Polyarelene ether, Polyethylene, Polystyrene or any other suitable material.

In the example of FIGS. 16A to 16C the transistor 161 is arranged in a bottom gate-top contact arrangement. In the example of FIGS. 16A to 16C the non-conductive curved support structure 7 supports the gate electrode 164. The gate electrode 164 may be deposited over the non-conductive curved support structure 7. The gate electrode 164 may directly overlay the non-conductive curved support structure 7.

The non-conductive curved support structure 7 also supports the source electrode 162 and the drain electrode 163. The source electrode 162 is provided on a first edge 41 of the non-conductive curved support structure 7 and the drain electrode 163 is provided on a second edge 43 of the non-conductive curved support structure 7. In the example of FIGS. 16A to 16C the electrodes 162, 163 extend along the length of the non-conductive curved support structure 7. This may be similar to the resistive sensor 30 arrangements described above.

The curved support structure 7 is also configured to support the active material 166. In the example of FIGS. 16A to 16C the active material 166 comprises a semiconductor. The active material 166 is provided between the two electrodes 162, 163. The active material 166 provides channel between the two electrodes 162, 163. In the example of FIGS. 16A to 16C the active material 166 is provided in the centre portions of the curved support structure 7. This may be the region of the curved support structure 7 which undergoes the least strain. This may minimise the strain within the active material 166 when the apparatus 1 is deformed. In the example of FIGS. 16A to 16C the active material 166 is provided in the apex of one of the loops 13 of the curved support structure 7. In other examples the active material 166 may be provided in other positions along the curved support structure 7.

The conductive curved support structure 7 is also configured to support the dielectric material 165. The dielectric 165 may be deposited overlaying the gate electrode 164 to prevent electrical contact between the gate electrode 164 and the source and drain electrodes 162, 163 and the active material 166. In the example of FIGS. 16A to 16C the dielectric material 164 is provided between the gate electrode 164 and the active material 166.

FIGS. 16D to 16F illustrate another apparatus 1 in which the curved support structure 7 comprises a non-conductive material. FIG. 16D illustrates a plan view of an apparatus 1. FIG. 16E illustrates a cross section through a portion of the apparatus 1 in which the transistor 161 is located. FIG. 16F illustrates a side view of a portion of the apparatus 1 in which the transistor 161 is located.

The example apparatus of FIGS. 16D to 16F may be similar to the example apparatus of FIGS. 16A to 16C except that in the examples of FIGS. 16D to 16F the curved support structure 7 also provides the dielectric material 165 within the transistor 161. In these examples the gate electrode 164 is provided underneath the non-conductive support structure 7 so that the non-conductive support structure 7 provides the dielectric material 165 between the gate electrode 164 and the active material 166. In the examples of FIGS. 16D to 16F the active material 166 may be deposited on the non-conductive support structure 7 so that the active material 166 directly overlays the non-conductive support structure 7.

FIGS. 17A to 17C illustrate another example apparatus 1 comprising a transistor 161 according to other examples of the disclosure. In the examples of FIGS. 17A to 17C the curved support structure 7 also comprises a non-conductive material. The example apparatus of FIGS. 17A to 17C comprises a top gate arrangement for the transistor 161.

FIG. 17A illustrates a plan view of an apparatus 1. FIG. 17B illustrates a cross section through a portion of the apparatus 1 in which the transistor 161 is located. FIG. 17C illustrates a side view of a portion of the apparatus 1 in which the transistor 161 is located. The example apparatus 1 comprises a curved support structure 7 and at least one support 5 which may be as described above. The curved support structure 7 may be configured to support components of the transistor 161.

In the example of FIGS. 17A to 17C the curved support structure 7 comprises a non-conductive material. The non-conductive material may comprise a polymer material such as polyimide, Flourinated polyimide, Methylsilsesquioxane, Polyarelene ether, Polyethylene, Polystyrene or any other suitable material.

In the example of FIGS. 17A to 17C the transistor 161 is arranged in a top gate-top contact arrangement. In the example of FIGS. 17A to 17C the non-conductive curved support structure 7 supports the gate electrode 164 and the source and drain electrodes 162, 163. The source electrode 162 is provided on a first edge 41 of the non-conductive curved support structure 7 and the drain electrode 163 is provided on a second edge 43 of the non-conductive curved support structure 7. The gate electrode is provided in a central portion of the non-conductive curved support structure 7. In the example of FIGS. 17A to 17C the source and drain electrodes 162, 163 extend from the left hand side of the transistor 161 and the gate electrode 164 extends from the right hand side of the transistor 161. It is to be appreciated that other examples of the electrodes 162, 163 and 164 may be used in other examples of the disclosure.

The curved support structure 7 is also configured to support the active material 166. In the example of FIGS. 17A to 17C the active material 166 comprises a semiconductor. The active material 166 is provided between the source and drain electrodes 162, 163. A dielectric material 165 is provided overlaying the active material 166. The gate electrode 164 is provided overlaying the dielectric 165 so that the dielectric 165 prevents electrical contact between the gate electrode 164 and the active material 166 and the source and drain electrodes 162, 163.

In the example of FIGS. 17A to 17C the transistor 161 is provided in the apex of one of the loops 13 of the curved support structure 7. In other examples the transistor 161 may be provided in other positions along the curved support structure 7.

In some examples apparatus 1 the transistors 161 may be provided individually and polled in isolation. This may enable the transistors 161 to be used as circuit elements or individual sensors. In some example apparatus 1 an array of transistors may also be produced to provide increased sensing capabilities.

FIGS. 18A and 18B illustrate an example of an apparatus 1 comprising an array 181 of transistors 161. The array 181 of transistors 161 may comprise a plurality of transistors 161. In some examples different transistors 161 within the array 181 may be configured to sense different parameters. In such examples different active materials 166 may be used in different transistors 161.

FIG. 18A illustrates a plan of a section of the apparatus 1. FIG. 18B provides an equivalent circuit diagram for a three by three array 181 of transistors 161. Each cell of the array 181 may be read independently by multiplexing read electronics. It is to be appreciated that the array 181 of transistors 161 may comprise any suitable number of transistors 161 in any suitable arrangement.

The apparatus 1 of FIGS. 18A and 18B comprise a deformable substrate 3, at least one support 5 and a curved support structure 7 which may be as described in relation to FIG. 1. Only one curved support structure 7 is illustrated in FIG. 18A however it is to be appreciated that the apparatus 1 may comprise a plurality of curved support structures 7. The plurality of curved support structures 7 may extend in the same direction.

In the example of FIGS. 18A and 18B the apparatus 1 also comprises a plurality of additional curved structures 75. The additional curved structures 75 may comprise an elongate member 11. The elongate member 11 may form a serpentine shape. The serpentine shape may be the same or similar to the serpentine shape of the curved support structure 7.

The additional curved structures 75 extend in a direction perpendicular to the curved support structures 7. The additional curved structures 75 are provided spaced along the length of the curved support structures 7 so that there are a plurality of intersecting points where an additional curved structure 75 crosses over a curved support structure 7.

The additional curved structures 75 are provided overlaying the curved support structures 7. The additional curved structures 75 provide cross connectors for the array 181 of transistors 161. In the example of FIG. 18A the additional curved structures 75 may comprise drain electrodes 163.

The example apparatus 1 of FIGS. 18A and 18B shows a bottom gate-top contact arrangement for the transistors 161. The arrangement could be as illustrated in examples of 15A to 16F. It is to be appreciated that other arrangements for the transistors 161 could be used in other examples.

In the examples of FIGS. 18A and 18B the source and drain electrodes 162, 163 are provided on the edges 41, 43 of the curved support structure 7. The active material 166 is provided between the source and drain electrodes 162, 163 in sections along the length of the curved support structure 7. In the example of FIGS. 18A and 18B the active material 166 is provided in the sections of the curved support structure 7 where the curved support structure 7 crosses over the at least one support 5.

A common gate electrode 164 may be provided for each of the transistors 161. This may allow multiplexing of the array 181.

An additional dielectric insulating material 183 is provided between the source electrode 162 and the additional support structure 75. The additional dielectric insulating material 183 may be configured to prevent a direct connection between the source electrode 162 and the cross connector.

FIG. 19 illustrates another example of an apparatus 1 which comprises an array 181 of transistors 161. The apparatus 1 may comprise, a deformable substrate 3 at least one support 5, a curved support structure 7, and a plurality of additional curved structures 75. The deformable substrate 3 at least one support 5, curved support structure 7, and plurality of additional curved structures 75 may be as described in relation to FIGS. 18A and 18B.

In the example apparatus 1 of FIG. 19 the transistors 161 are provided on the curved support structure 7. The transistors 161 may be as described above however in the example of FIG. 19 the active material 166 is provided in the apex of the loops of the curved support structure 7. The intersections between the additional curved structures 7 and the curved support structure 7 are provided in the sections of the curved support structure 7 where the curved support structure 7 crosses over the at least one support 5. This may allow for a denser array 181 of transistors 161.

FIGS. 20A to 20C illustrate another example of an apparatus 1 which comprises an array 181 of transistors 161. The apparatus 1 may comprise, a deformable substrate 3 at least one support 5, a curved support structure 7, and a plurality of additional curved structures 75. The deformable substrate 3 at least one support 5, curved support structure 7, and plurality of additional curved structures 75 may be as described in relation to FIGS. 18A to 19.

In the example apparatus 1 of FIGS. 20A to 20C the transistors 161 are provided in a top gate-top contact arrangement. FIG. 20A illustrates a plan view of the apparatus 1. FIG. 20B illustrates a detailed plan view of a section in which additional dielectric insulating material 183 is provided. FIG. 20C a detailed plan view of a section in which active material 166 and dielectric 165 of the transistor 161 are provided.

In the example of FIGS. 20A to 20C a common gate electrode 164 is provided for each of the transistors 161. The common gate electrode 164 may be provided in the centre of the curved support structure 7. The common gate electrode 164 may extend along the length of the curved support structure 7.

FIG. 20B shows that the additional dielectric insulating material 183 is configured to prevent direct electrical contact between the drain electrode 162 which is provide on the additional curved structure 7 and the gate electrode 164 and the source electrode 162 which are provided on the curved support structure 7.

FIG. 20C shows a plan view of an example transistor 161. The transistor 161 comprises an active material 166 between the source and drain electrodes 162, 163 and a dielectric material 165 configured to prevent direct electrical contact between the gate 164 electrode 164 and the source and drain electrodes 162, 163. In the example of FIGS. 20A to 20C the active material 166 is provided in the apex of the loops of the curved support structure 7. It is to be appreciated that in other examples of the disclosure the active material 166 may be provided in other locations.

FIGS. 21A to 21T illustrate an example method of providing an apparatus 1 comprising a transistor 161. The example method of FIGS. 21A to 21T may be used to provide an apparatus 1 comprising a bottom gate-top contact arrangement supported by a non-conductive curved support structure 7. Examples of such apparatus 1 are illustrated in FIGS. 16A to 16C. It is to be appreciated that other arrangements of transistor 161 may be provided by exchanging the order of the relevant blocks of the method.

In FIG. 21A a release layer 111 is deposited on a silicon wafer 113. In FIG. 21B a photoresist layer 115 is deposited on the release layer 111. The photoresist layer 115 is patterned as a drain electrode 163. In FIG. 21C a conductive material 117 is deposited on the photoresist layer 115. The conductive material 117 may comprise metal. The conductive material 117 may be deposited using any suitable means such as evaporation or sputtering. In FIG. 21D the photoresist layer 115 is removed and the drain electrode 163 is left on the release layer 111.

In the example of FIGS. 21B to 21D the drain electrode 163 which is formed may provide the drain electrode 163 as illustrated in FIGS. 18A to 19. This drain electrode 163 may comprise part of an additional curved structure 75 and extend along a portion of a curved support structure 7.

Figure 21E:
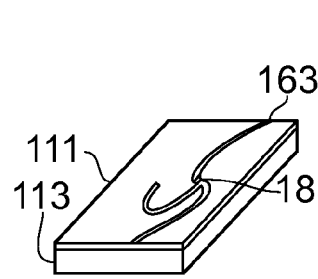
Figure 21F:
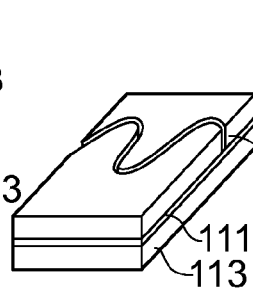
Figure 21G:
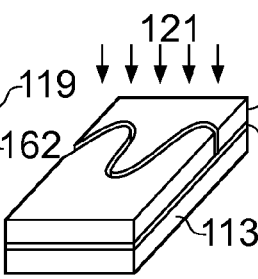
Figure 21H:
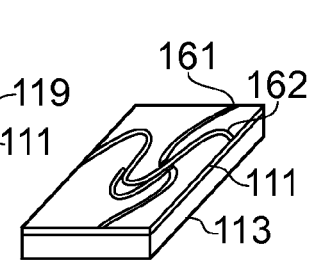

In FIG. 21E additional dielectric insulating material 183 is deposited on the drain electrode 163. The additional dielectric insulating material 183 may be deposited using any suitable means such as inkjet printing or screen printing. In FIG. 21F another photoresist layer 119 is deposited on the release layer 111. The photoresist layer 119 is patterned as a source electrode 162. In FIG. 21G a conductive material 121, such as metal, is deposited on the photoresist layer 119. The conductive material 121 may be deposited using any suitable means such as evaporation or sputtering. In FIG. 21H the photoresist layer 119 is removed and the source electrode 162 and drain electrode 163 are left on the release layer 111.

The source electrode 162 which is formed in the blocks of the method of FIGS. 21F to 21H may form the source electrode 162 as illustrated in FIGS. 18A to 19. This source electrode 162 may be arranged to extend along a portion of a curved support structure 7.

Figure 21I:
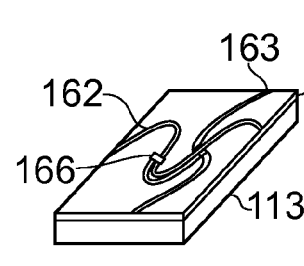

In FIG. 21I an active material 166 is deposited. The active material 166 is deposited between the source electrode 162 and drain electrode 163. The active material 166 may comprise a semiconductor or any other suitable material. The active material 166 may be deposited using any suitable technique such as inkjet printing, screen print printing, using a photoresist mask and sputtering, atomic layer deposition or any other suitable method. The method used to deposit the active material 166 may depend on the material which is used. For instance graphene may be transferred and patterned through a photoresist mask, pentacene and PDOT: PSS may be printed from a solution using techniques such as inkjet printing or screen printing, P3HT may be spray deposited through a mask and ZnO may be deposited by atomic layer deposition through a mask. Other methods may be used in other examples.

Figure 21J:
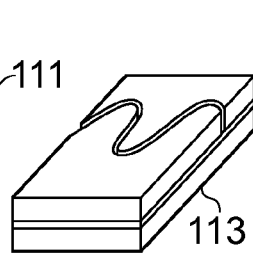
Figure 21K:
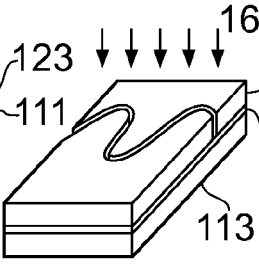
Figure 21L:
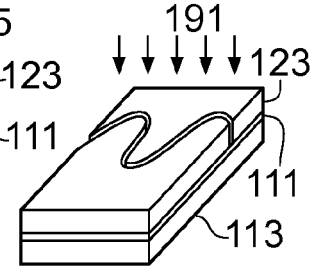

In FIG. 21J another photoresist layer 123 is deposited on the release layer 111. The photoresist layer 123 is patterned as dielectric material 165 and the gate electrode 164. In FIG. 21K the dielectric material 165 is deposited on the photoresist layer 123. The dielectric material 165 may comprise any suitable insulating material such as a polymer. The dielectric material 165 may have the same serpentine shape as the curved support structure 7. The dielectric material may be deposited using any suitable technique such as spin coating, evaporation, sputtering or any other suitable method.

Figure 21M:
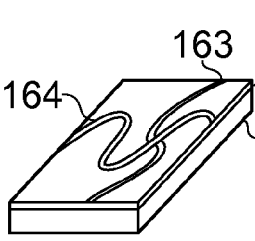

In FIG. 21K a conductive material 191, such as metal, is deposited on the photoresist layer 123. The conductive material 191 may be deposited using any suitable means such as evaporation or sputtering. The conductive material 191 is patterned as the gate electrode 164. In FIG. 21M the photoresist layer 123 is removed and the gate electrode 164 and the dielectric material 165 are left on the release layer 111 to form a transistor 161.

Figure 21N:
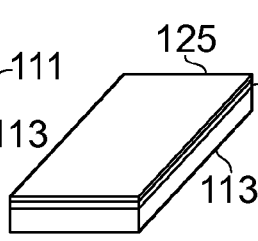
Figure 21O:
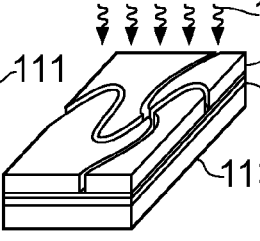
Figure 21P:
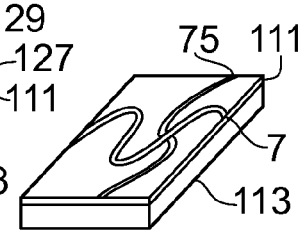

In FIG. 21N a polymer 125 is deposited onto the electrodes 31, 33. The polymer 125 may be a photopatternable polymer. The polymer 125 may be spin coated over the transistor 161. In other examples other means for depositing the polymer 125 may be used. In FIG. 21O another photoresist layer 127 is deposited on the polymer 125. The photoresist layer 127 is patterned as the curved support structure 7 and the additional curved structure 75. The polymer 125 is then exposed to ultra-violet (UV) light 129. The UV light 129 hardens the polymer 125 which is exposed to the UV light by increasing the number of crosslinks in the polymer 125. The portions of the polymer 125 which are not exposed to UV light 129 remain as uncrosslinked polymer 125. In FIG. 21P the photoresist layer 127 and the uncrosslinked polymer are removed. This leaves a non-conductive curved support structure 7 and additional curved support structure 75.

Figure 21Q:
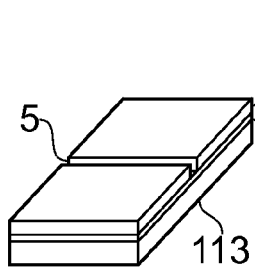
Figure 21R:
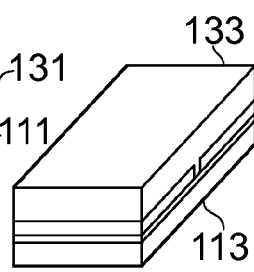
Figure 21S:
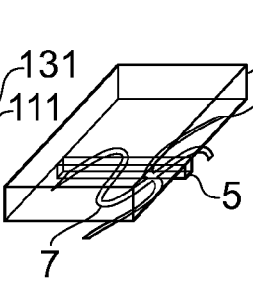
Figure 21T:
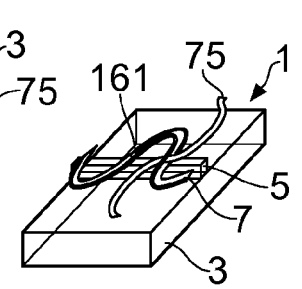

In FIG. 21Q a further photoresist layer 131 is deposited. The further photoresist layer 131 is patterned as the at least one support 5. In the example of FIG. 21Q the at least one support 5 comprises a beam 6. In FIG. 21R an elastomer layer 133 is cast against the further photoresist layer 131 and cured. In FIG. 21S the further photoresist layer 131 and the lift off layer 111 are removed leaving a deformable substrate 3, beam 6 and curved support structure 7. In FIG. 21T the structure is inverted to leave an apparatus 1 as described above.

The example methods of FIGS. 12A to 13 maybe used to from an upper portion of a deformable substrate and combine this with an apparatus such as the apparatus produced in FIGS. 21A to 21T.

Examples of the disclosure provide an apparatus 1 which can be used for sensing. As the resistive sensors 30 and transistors 161 within the apparatus 1 are not affected by the deformation of the apparatus 1 this makes the apparatus 1 suitable for use in bendable or deformable electronic devices. For example the apparatus 1 may be used in wearable electronic devices.

In examples of the apparatus 1 the curved support structure 7 is coupled to the deformable substrate 3 via the at least one support 5 which enables the curved support structure 7 to be positioned spaced from the deformable substrate 3. When a user applies a force to the deformable substrate 3 this may cause a change in size or shape of the deformable substrate 3. As the curved support structure 7 is not directly coupled to the deformable substrate 3 the forces applied to the deformable substrate are not also applied to the curved support structure 7. This means that the conductive portion does not bend or change size or shape in the same way that the deformable substrate does. This may reduce the amount of stress within the curved support structure 7 and reduce the likelihood of failure due to fatigue.

Also in examples of the disclosure the resistive sensors 30 and transistors 161 are provided on the curved support structure 7 and not as additional rigid portions. This means that the resistive sensors 30 and transistors 161 do not add any rigid portions to the apparatus and do not reduce the flexibility of the apparatus 1.

The resistive sensors 30 and transistors 161 may be arranged so that an array 71 of resistive sensors 30 or an array 181 of transistors 161 can be read by commercially available electronics. The array 71 of resistive sensors 30 or array 181 of transistors 161 may comprise any number of resistive sensors 30 or transistors 161. This may enable information to be obtained from a large number of resistive sensors 30 or transistors 161.

The term "comprise" is used in this document with an inclusive not an exclusive meaning. That is any reference to X comprising Y indicates that X may comprise only one Y or may comprise more than one Y. If it is intended to use "comprise" with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term "example" or "for example" or "may" in the text denotes, whether explicitly stated or not, that such features or functions are present in at least the described example, whether described as an example or not, and that they can be, but are not necessarily, present in some of or all other examples. Thus "example", "for example" or "may" refers to a particular instance in a class of examples. A property of the instance can be a property of only that instance or a property of the class or a property of a sub-class of the class that includes some but not all of the instances in the class. It is therefore implicitly disclosed that a features described with reference to one example but not with reference to another example, can where possible be used in that other example but does not necessarily have to be used in that other example.

Although examples of the present disclosure have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain examples, those features may also be present in other examples whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
a deformable substrate;
a curved support structure configured to support at least a portion of a resistive sensor wherein the resistive sensor comprises a first electrode, a second electrode and a resistive sensor material provided between the electrodes; and
at least one support configured to space the curved support structure from the deformable substrate so that when the deformable substrate is deformed the curved support structure is not deformed in the same way;
wherein the resistive sensor is positioned on the curved support structure so as to limit deformation of the resistive sensor when the deformable substrate is deformed.

2. An apparatus as claimed in claim 1 wherein the electrodes extend along a length of the curved support structure.

3. An apparatus as claimed in claim 1 wherein a plurality of resistive sensors are provided on the curved support structure.

4. An apparatus as claimed in claim 1 wherein a plurality of curved support structures are provided.

5. An apparatus as claimed in claim 1 wherein a first plurality of curved support structures are provided extending in a first direction and a second plurality of curved structures are provided overlaying the first plurality of curved support structures and extending in a second direction where the second direction is perpendicular to the first direction.

6. An apparatus as claimed in claim 5 wherein the second electrode is provided on a second curved structure.

7. An apparatus as claimed in claim 6 wherein the first curved support structure comprises a polymer layer provided between the first electrode and the second electrode and a via is provided through the polymer layer to connect the first electrode and the second electrode.

8. An apparatus as claimed in claim 1 wherein the first curved support structure comprises the first electrode such that the resistive sensor material and the second electrode are supported by the first electrode.

9. An apparatus as claimed in claim 1 wherein the first curved support structure comprises a polymer layer and the first and second electrodes and the resistive sensor material are supported by the polymer layer.

10. An apparatus as claimed in claim 1 wherein the resistive sensor comprises a transistor.

11. An apparatus as claimed in claim 1 wherein the deformable substrate forms a cavity in which the curved support structure and resistive sensor are provided.

12. An apparatus as claimed in claim 1 wherein a radius of curvature of the curved support structure is parallel to a plane of the deformable substrate and wherein the curved support structure has a serpentine shape and the serpentine shape comprises a plurality of loops such that a loop which extends to a left hand side is followed by a loop which extends to a right hand side.

13. An apparatus as claimed in claim 1 wherein the deformable substrate is configured to be deformed in response to a force applied by a user.

14. An electronic device comprising an apparatus as claimed in claim 1.

15. A method comprising:
providing a deformable substrate;
providing a curved support structure configured to support at least a portion of a resistive sensor wherein the resistive sensor comprises a first electrode, a second electrode and a resistive sensor material provided between the electrodes;
providing at least one support configured to space the curved support structure from the deformable substrate so that when the deformable substrate is deformed the curved support structure is not deformed in the same way;
wherein the resistive sensor is positioned on the curved support structure so as to limit deformation of the resistive sensor when the deformable substrate is deformed.

16. A method as claimed in claim 15 wherein the electrodes extend along a length of the curved support structure.

17. A method as claimed in claim 15 wherein a plurality of resistive sensors are provided on the curved support structure.

18. A method as claimed in claim 15 wherein a plurality of curved support structures are provided.

19. A method as claimed in claim 15 wherein a first plurality of curved support structures are provided extending in a first direction and a second plurality of curved structures are provided overlaying the first plurality of curved support structures and extending in a second direction where the second direction is perpendicular to the first direction.

20. A method as claimed in claim 15 wherein the second electrode is provided on a second curved structure.

* * * * *